(12) United States Patent
Chen et al.

(10) Patent No.: US 12,677,563 B2
(45) Date of Patent: Jul. 7, 2026

(54) DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Yipeng Chen, Beijing (CN); Ling Shi, Beijing (CN); Ke Liu, Beijing (CN); Hui Lu, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 770 days.

(21) Appl. No.: 17/922,508

(22) PCT Filed: Nov. 19, 2021

(86) PCT No.: PCT/CN2021/131784
§ 371 (c)(1),
(2) Date: Oct. 31, 2022

(87) PCT Pub. No.: WO2022/193712
PCT Pub. Date: Sep. 22, 2022

(65) Prior Publication Data
US 2023/0269985 A1 Aug. 24, 2023

(30) Foreign Application Priority Data
Mar. 16, 2021 (CN) ........................ 202110282322.X

(51) Int. Cl.
*H10K 59/121* (2023.01)
*G09G 3/3208* (2016.01)
(Continued)

(52) U.S. Cl.
CPC ......... *H10K 59/353* (2023.02); *G09G 3/3208* (2013.01); *H10K 59/121* (2023.02);
(Continued)

(58) Field of Classification Search
CPC .. H10K 59/353; H10K 59/121; H10K 59/131; H10K 59/65; H10K 59/38;
(Continued)

(56) References Cited

U.S. PATENT DOCUMENTS 10,466,746 B2 11/2019 Hong et al.
10,756,136 B1 8/2020 Ma et al.
(Continued)

FOREIGN PATENT DOCUMENTS

CN 110061014 A 7/2019
CN 110767139 A 2/2020
(Continued)

OTHER PUBLICATIONS

International Search Report and Written Opinion issue Feb. 9, 2022, in corresponding International Application No. PCT/CN2021/131784.

*Primary Examiner* — Adam R. Giesy
(74) *Attorney, Agent, or Firm* — XSENSUS LLP

(57) ABSTRACT

The present disclosure relates to the field of display technology, and provides a display panel and a display device. The display panel includes a first display area and a second display area, and further includes a plurality of first pixel islands. The first pixel islands are in the first display area and include: at least one first light-emitting unit; at least one first pixel driving circuit, arranged in a one-to-one correspondence with the at least one first light-emitting unit, and configured to provide a driving current to a first light-emitting unit corresponding thereto; and a plurality of first
(Continued)

signal line segments configured to provide signals to the at least one first pixel driving circuit.

19 Claims, 18 Drawing Sheets

(51) Int. Cl.

| | |
|---|---|
| H10K 59/131 | (2023.01) |
| H10K 59/35 | (2023.01) |
| *G09G 3/3233* | (2016.01) |
| *H10K 59/65* | (2023.01) |

(52) U.S. Cl.
CPC ......... H10K 59/131 (2023.02); *G09G 3/3233* (2013.01); *H10K 59/65* (2023.02)

(58) Field of Classification Search
CPC .. H10K 59/126; G09G 3/3208; G09G 3/3233; H04M 1/0266
See application file for complete search history.

(56) References Cited

U.S. PATENT DOCUMENTS

| | | | | |
|---|---|---|---|---|
| 10,802,545 | B2 | 10/2020 | Hong et al. | |
| 2018/0052493 | A1 | 2/2018 | Hong et al. | |
| 2020/0026332 | A1 | 1/2020 | Hong et al. | |
| 2021/0248945 | A1* | 8/2021 | Liu ........................ | H04N 23/57 |

FOREIGN PATENT DOCUMENTS

| | | |
|---|---|---|
| CN | 113053982 A | 6/2021 |
| EP | 3 882 897 A1 | 9/2021 |

* cited by examiner

DISPLAY PANEL AND DISPLAY DEVICE

CROSS-REFERENCE TO RELATED APPLICATIONS

This application is a national phase entry under 35 U.S.C. § 371 of International Application No. PCT/CN2021/131784, filed on Dec. 19, 2021 and claims the priority of the Chinese Patent Application No. 202110282322.X, filed on Mar. 16, 2021, and entitled "DISPLAY PANEL AND DISPLAY DEVICE," the entire contents of which are hereby incorporated by reference in their entireties.

TECHNICAL FIELD

The present disclosure relates to the field of display technology, and in particular, to a display panel and a display device.

BACKGROUND

In the related art, a display panel generally includes a high-pixel area and a low-pixel area, and an area where the low-pixel area is located may be used to integrate sensor devices such as cameras and earpieces. In the related art, the display panel is generally provided with light-emitting units only in the low-pixel area, and pixel driving circuits for driving the light-emitting units in the low-pixel area is provided in a circuit integration area between the high-pixel area and the low-pixel area, thereby increasing the transmittance of the low-pixel area. However, the circuit integration area in the display panel may form a non-display area.

It should be noted that the above information disclosed in the background section is only used to enhance the understanding of the background of the present disclosure, and therefore may include information that does not constitute the prior art known to those of ordinary skill in the art.

SUMMARY

According to an aspect of the present disclosure, there is provided a display panel, including a first display area and a second display area. The display panel further includes a plurality of first pixel islands. The plurality of first pixel islands are in the first display area, and include at least one first light-emitting unit, at least one first pixel driving circuit, and a plurality of first signal line segments. The at least one first pixel driving circuit is arranged in a one-to-one correspondence with the at least one first light-emitting unit, and configured to provide a driving current to a first light-emitting unit corresponding thereto.

According to an aspect of the present disclosure, there is provided a display device, including: the above display panel and a sensing device, the sensing device being directly opposite to the first display area of the display panel.

It should be understood that the above general description and the following detailed description are only exemplary and explanatory, and cannot limit the present disclosure.

BRIEF DESCRIPTION OF THE DRAWINGS

The drawings herein, which are incorporated in and constitute a part of the specification, illustrate embodiments consistent with the present disclosure, and serve to explain the principles of the present disclosure together with the specification. Obviously, the drawings in the following description are only some embodiments of the present disclosure. For those of ordinary skill in the art, other drawings may be obtained based on these drawings without creative efforts.

DETAILED DESCRIPTION

Figure 1:
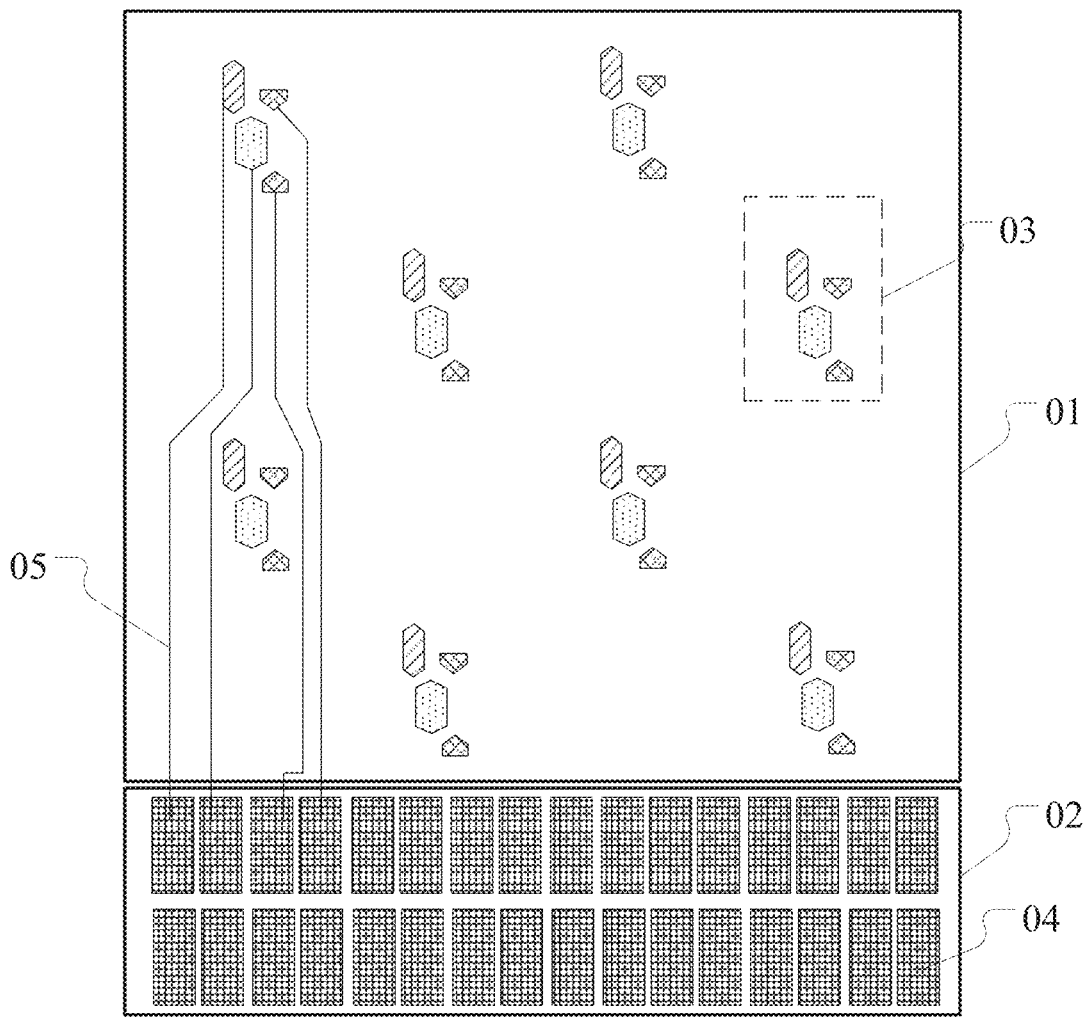
FIG. 1 is a schematic diagram of a partial structure of a display panel in the related art.

Example embodiments will now be described more fully with reference to the accompanying drawings. The example embodiments, however, can be embodied in various forms and should not be construed as limited to the examples set forth herein; rather, these embodiments are provided so that this disclosure will be thorough and complete, and will fully convey the concept of example embodiments to those skilled in the art. The same reference numerals in the drawings denote the same or similar structures, and thus their detailed descriptions will be omitted.

Although relative terms such as "above" and "below" are used in this specification to describe the relative relationship between one component illustrated in the drawings and another component, these terms are used in this specification for convenience only, for example, according to the illustrative direction depicted in the drawings. It can be understood that if the device illustrated in the drawings is inversed and turned upside down, the component described as being "above" would become the component described as being "below". Other relative terms, such as "high", "low", "top", "bottom", "left" and "right", are also used to have similar meanings. When a certain structure is "on" other structures, it may mean that the structure is integrally formed on other structures, or that the structure is "directly" arranged on other structures, or that the structure is "indirectly" arranged on other structures through another structure.

The terms "a", "an", and "the" are used to indicate the presence of one or more elements/components/etc. The terms "including" and "having" are used to indicate an open-ended inclusive meaning and mean that there may be additional elements/components/etc., in addition to the listed elements/components/etc.

As shown in FIG. 1, which is a schematic diagram of a partial structure of a display panel in the related art, the display panel includes a low pixel density area 01 and a circuit integration area 02, and the circuit integration area 02 may be located between a high pixel density area (not shown) and the low pixel density area 01. A plurality of light-emitting units 03 may be integrated in the low pixel density area 01, and a plurality of pixel driving circuits 04 may be integrated in the circuit integration area 02. The pixel driving circuit 04 may be used to provide a driving current to the light-emitting unit 03 through transmission lines 05. The display panel may have greater light transmittance in the low pixel density area 01. However, since the circuit integration area 02 does not emit light, the display panel may have a non-light-emitting area in the circuit integration area 02, thereby affecting the display effect. In addition, since the integration density of the transmission lines 05 is limited by the process, the diameter of the low pixel density area 01 cannot be too large.

Figure 2:
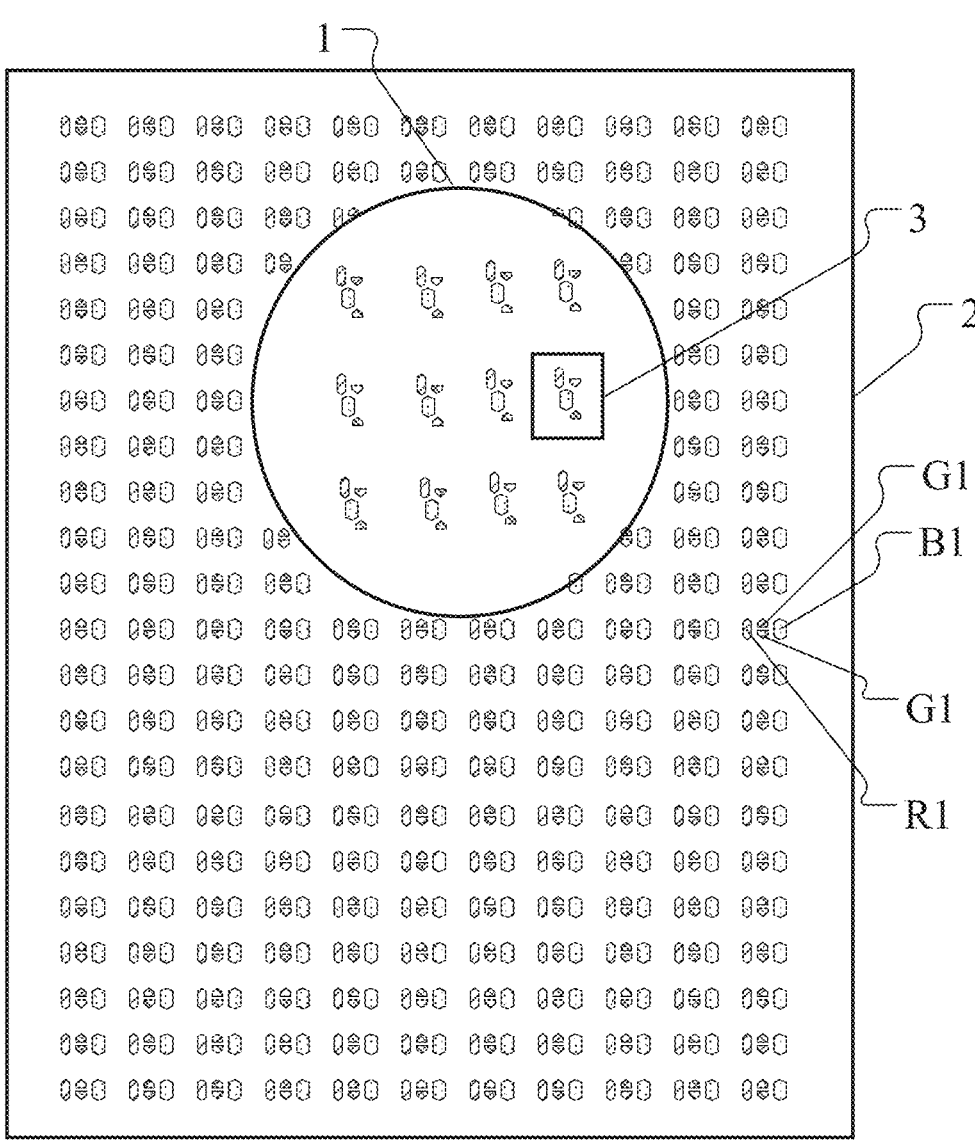
FIG. 2 is a schematic structural diagram of a display panel according to an exemplary embodiment of the present disclosure.
Figure 3:
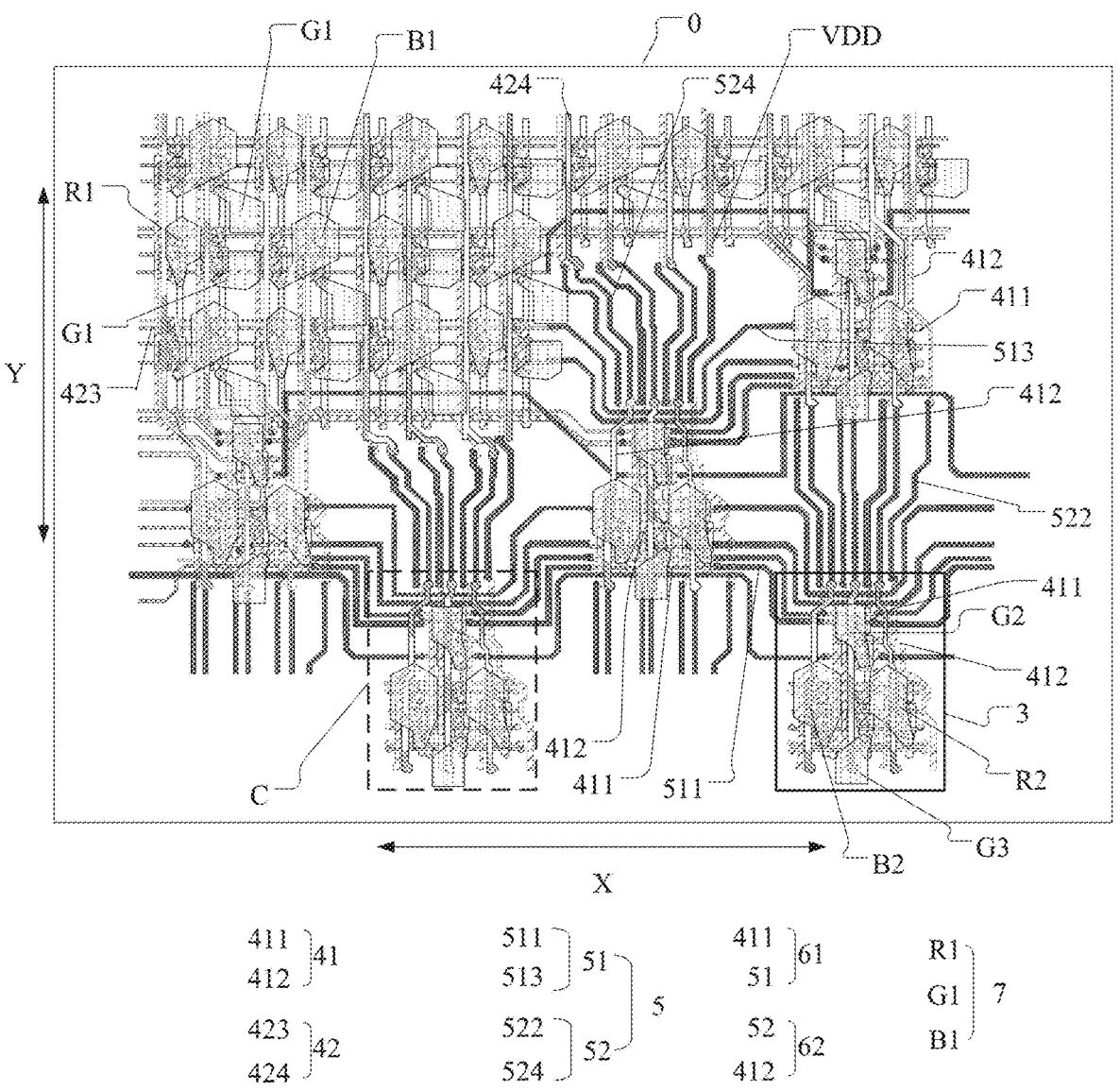
FIG. 3 is an enlarged view of a portion in FIG. 2.

In view of above, the exemplary embodiments provide a display panel, as shown in FIGS. 2 and 3. FIG. 2 is a schematic structural diagram of a display panel according to an exemplary embodiment of the present disclosure, and FIG. 3 is an enlarged view of a portion in FIG. 2. The display panel includes a first display area 1 and a second display area 2. The display panel may further include: a plurality of first pixel islands 3 and a plurality of transparent bridging line segments 5. The first pixel islands 3 are located in the in the first display area 1 and may include a plurality of first signal line segments 41. The plurality of transparent bridging line segments 5 are located in the first display area 1, at least some of the transparent bridging line segments 5 being configured to connect the first signal line segments 41 in different first pixel islands 3 through via holes. Sensor devices such as a camera, an earpiece, and an infrared sensor may be correspondingly disposed at the location of the first display area.

In the exemplary embodiments, the first pixel island may include: at least one first light-emitting unit; and at least one first pixel driving circuit arranged in a one-to-one correspondence with the first light-emitting unit. The first pixel driving circuit is configured to provide a driving current to the first light-emitting unit corresponding thereto. The first signal line segments may include one or more types of a data line, a power supply line, a gate driving signal line, an initial signal line, a reset signal line, and an enable signal line. The transparent bridging line segments 5 may be configured to connect signal lines of the same type of signal. On the one hand, in the present disclosure, the first pixel driving circuits for driving the first light-emitting units are arranged in the first display area, thereby avoiding the existence of a circuit integration area that does not emit light in the display panel. On the other hand, in the present disclosure, the light transmittance of the first display area may be increased by connecting the first signal line segments in different pixel islands through the transparent bridging line segments located in the first display area. Further, the diameter of the first display area in the display panel is not limited, for example, the first display area is provided as any shape, such as circle, ellipse, rectangle, etc.

In the exemplary embodiments, as shown in FIG. 3, the display panel further includes a base substrate 0. The first pixel islands 3 are located on a side of the base substrate 0. The plurality of first signal line segments 41 may include first sub-signal line segments 411 and second sub-signal line segments 412. The orthographic projection of the first sub-signal line segment 411 on the base substrate 0 extends along a first direction X. The orthographic projection of the second sub-signal line segment 412 on the base substrate 0 extends along a second direction Y. The first direction X intersects with the second direction Y. For example, the first direction may be a row direction, and the second direction may be a column direction. The plurality of transparent bridging line segments 5 may include first transparent bridging line segments 51 and second transparent bridging line segments 52. The first transparent bridging line segments 51 may include first sub-transparent bridging line segments 511. The first sub-transparent bridging line segments 511 may be located in the first display area 1 and configured to connect the first sub-signal line segments 411 in different first pixel islands through via holes. The plurality of second transparent bridging line segments 52 may include second sub-transparent bridging line segments 522. The second sub-transparent bridging line segments 522 may be located in the first display area 1 and configured to connect the second sub-signal line segments 412 in different first pixel islands through via holes.

In the exemplary embodiment, as shown in FIGS. 2 and 3, the display panel may further include a plurality of second light-emitting units 7, a plurality of second pixel driving circuits, and a plurality of second signal line segments 42. The plurality of second light-emitting units 7 may be located in the second display area 2. The plurality of second pixel driving circuits are located in the second display area 2, arranged in a one-to-one correspondence with the plurality of the second light-emitting units 7, and configured to provide a driving current to the second light-emitting units 7 corresponding thereto, respectively. The orthographic projection area of the second light-emitting unit on the base substrate may be equal to the orthographic projection area of the first light-emitting unit on the base substrate. The plurality of second signal line segments 42 are located in the second display area 2 and configured to provide signals to the second pixel driving circuits. At least some of the transparent bridging line segments 5 are configured to connect the first signal line segments 41 and the second signal line segments 42 through via holes. The second signal line segments may include one or more types of a data line, a power supply line, a gate driving signal line, an initial signal line, a reset signal line, and an enable signal line. The transparent bridging line segments 5 may be configured to connect the first signal line segments 41 and the second signal line segments 42 of the same type.

As shown in FIG. 3, the plurality of second signal line segments 42 may include: third sub-signal line segments 423 and fourth sub-signal line segments 424. The orthographic projection of the third sub-signal line segment 423 on the base substrate 0 may extend along the first direction X. The orthographic projection of the fourth sub-signal line segment 424 on the base substrate 0 may extend along the second direction Y. The plurality of first transparent bridging line segments 51 may further include third sub-transparent bridging line segments 513. The third sub-transparent bridging line segments 513 may be located in the first display area 1 and configured to connect the first sub-signal line segments 411 in the first display area 1 and the third sub-signal line segments 423 in the second display area through via holes. The plurality of second transparent bridging line segments 52 may further include fourth sub-transparent bridging line segments 524. The fourth sub-transparent bridging line segments 524 may be located in the first display area 1 and configured to connect the second sub-signal line segments 412 and the fourth sub-signal line segments 424 through via holes.

In the exemplary embodiments, as shown in FIG. 3, the pixel density of the first display area 1 may be smaller than the pixel density of the second display area 2. The size of the first display area may be X. Then, the pixel density of the first display area 1 being smaller than the pixel density of the second display area 2 may be understood as follows: the number of pixel units in the second display area within the size of X is greater than the number of pixel units in the first display area. For example, the number of pixel units in the second display area within the size of X may be four times the number of pixel units in the first display area. It should be understood that, in other exemplary embodiments, the pixel density of the first display area 1 may also be equal to the pixel density of the second display area 2. Accordingly, the light transmittance of the first display area may be increased by reducing the layout area of the first pixel driving circuits and the first light-emitting units in the first display area. That is, in light-emitting units of the same color, the orthographic projection area of the first light-emitting unit on the base substrate may be smaller than the orthographic projection area of the second light-emitting unit on the base substrate. In the present disclosure, the orthographic projections of the transparent bridging line segments, the first signal line segments, and the second signal line segments on the base substrate may be extended straight or bent.

In the exemplary embodiments, the transparent bridging line segments may be located on the same conductive layer. As shown in FIG. 3, the first transparent bridging line segment 51 and the first sub-signal line segment 411 connected to each other may form a first extension line 61, and the first extension line 61 may transmit the signal on the first sub-signal line segment 411. The second transparent bridging line segment 52 and the second sub-signal line segment 412 connected to each other may form a second extension line 62, and the second extension line 62 may transmit the signal on the second sub-signal line segment 412. The orthographic projection of the first extension line 61 on the base substrate 0 may be bent and extended. An intersection, of the orthographic projection of the first extension line 61 on the base substrate and the orthographic projection of the second extension line 62 on the base substrate, is located at an intersection, of the orthographic projection of the second sub-signal line segment 412 on the base substrate and the orthographic projection of the first transparent bridging line segment 51 on the base substrate, in this way, the transparent bridging line segment extending along the first direction X is disjoint from the transparent bridging line segment extending along the second direction Y. It should be understood that, in other exemplary embodiments, the orthographic projection of the first extension line 61 on the base substrate 0 may also extend straight.

It should be understood that, in other exemplary embodiments, the first transparent bridging line segment and the first sub-signal line segment connected to each other may form a first extension line, and the second transparent bridging line segment and the second sub-signal line segment connected to each other may form a second extension line. The orthographic projection of the second extension line on the base substrate may be bent and extended. An intersection, of the orthographic projection of the first extension line on the base substrate and the orthographic projection of the second extension line on the base substrate, may be located at an intersection, of the orthographic projection of the first sub-signal line segment on the base substrate and the orthographic projection of the second transparent bridging line segment on the base substrate, in this way, it is also possible for the transparent bridging line segment extending along the first direction X and the transparent bridging line segment extending along the second direction Y to disjoint. It should be understood that, in other exemplary embodiments, the orthographic projection of the second extension line on the base substrate may also extend straight.

In the exemplary embodiments, as shown in FIGS. 2 and 3, the plurality of second light-emitting units 7 may include: first red (R) light-emitting units R1, first green (G) light-emitting units G1, and first blue (B) light-emitting units B1. The first R light-emitting units R1, the first G light-emitting units G1, and the first B light-emitting units B1 are alternately distributed along the same light-emitting unit row. In the same light-emitting unit row, two first G light-emitting units G1 distributed along a column direction are disposed between a first R light-emitting unit R1 and a first B light-emitting unit B1. In adjacent light-emitting unit rows, light-emitting units having the same color are located in different light-emitting unit columns, and in two light-emitting unit rows separated by one light-emitting unit row, the light-emitting units having the same color are located in the same light-emitting unit column. That is, the second light-emitting units in the second display area are distributed in an RGGB pixel structure. It should be understood that, in other exemplary embodiments, the second light-emitting units in the second display area may also be distributed in other pixel structures, for example, a Real RGB pixel structure.

In the exemplary embodiments, as shown in FIGS. 2 and 3, at least one of the first light-emitting units in the first pixel islands may include: a second R light-emitting unit R2, a second G light-emitting unit G2, a third G light-emitting unit G3, and a second B light-emitting unit B2. In the same first pixel island, the second G light-emitting unit G2 may be located in a first light-emitting unit row, the second R light-emitting unit R2 and the second B light-emitting unit B2 may be adjacently arranged on a second light-emitting unit row, and the third G light-emitting unit G3 may be located in a third light-emitting unit row, where the second light-emitting unit row may be located between the first light-emitting unit row and the third light-emitting unit row. The second B light-emitting unit B2 may be located in a first light-emitting unit column, the second G light-emitting units G2 and the third G light-emitting units G3 may be located in a second light-emitting unit column, and the second R light-emitting unit R2 may be located a third light-emitting unit column, where the second light-emitting unit column may be located between the first light-emitting unit column and the third light-emitting unit column. In the column direction, the second G light-emitting unit G2 and the third G light-emitting unit G3 may be spaced by one light-emitting unit row. Here, the aperture ratio of the first display area may reach 67.89%, and the light transmittance may reach 36.61% under the arrangement of the pixel structure of the first pixel islands in the first display area.

Figure 4:
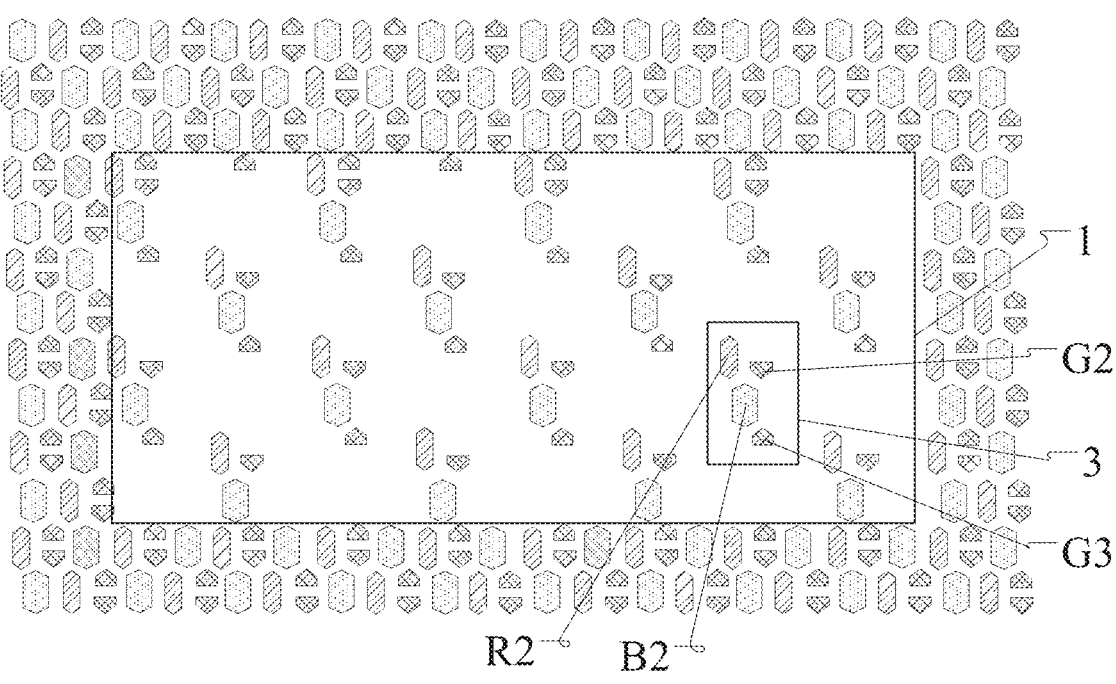
FIG. 4 is a schematic structural diagram of a display panel according to another exemplary embodiment of the present disclosure.

It should be understood that, in other exemplary embodiments, the first pixel islands 3 may further include other numbers of light-emitting units, and the light-emitting units in the first pixel islands 3 may also have other pixel structure arrangements. For example, FIG. 4 shows a schematic structural diagram of a display panel according to another exemplary embodiment of the present disclosure. In the first display area 1, the second R light-emitting unit R2 and the second G light-emitting unit G2 are located in a first light-emitting unit row, the second B light-emitting unit B2 is located in a second light-emitting unit row, and the third G light-emitting unit G3 is located in a third light-emitting unit row, where the second light-emitting unit row is located between the first light-emitting unit row and the third light-emitting unit row. And the second R light-emitting unit R2 is located in a first light-emitting unit column, the second B light-emitting unit B2 is located in a second light-emitting unit column, and the second G light-emitting unit G2 and the third G light-emitting unit G3 are located a third light-emitting unit column, where the second light-emitting unit column is located between the first light-emitting unit column and the third light-emitting unit column. In the column direction, the second G light-emitting unit G2 and the third G light-emitting unit G3 may be spaced by one light-emitting unit row. Correspondingly, in the pixel structure arrangement, the pixel driving circuits in the first pixel islands are arranged in a two-by-two array. Here, the aperture ratio of the first display area may reach 71.5%, and the light transmittance may reach 38.55% under the arrangement of the pixel structure of the first pixel islands in the first display area.

Figure 5:
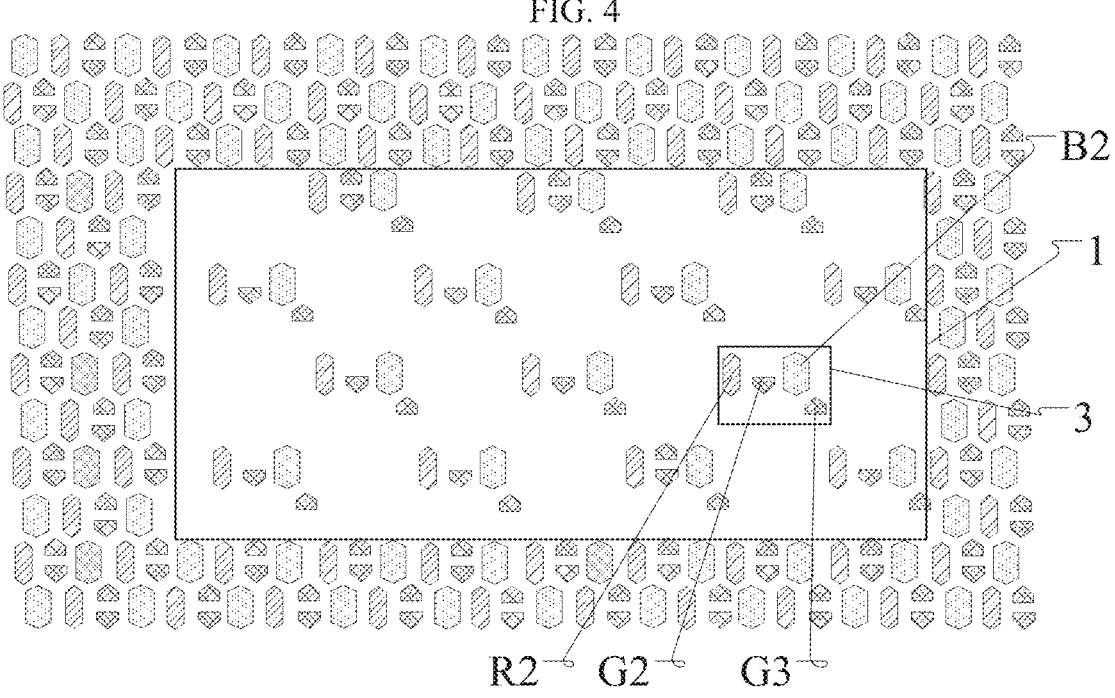
FIG. 5 is a schematic structural diagram of a display panel according to yet another exemplary embodiment of the present disclosure.

For another example, FIG. 5 shows a schematic structural diagram of a display panel according to another exemplary embodiment of the present disclosure. In the first display area 1, the second R light-emitting unit R2, the second G light-emitting unit G2, and the second B light-emitting unit B2 may be located in a first light-emitting unit row, and the third G light-emitting unit G3 is located in a second light-emitting unit row, where the first light-emitting unit row and the second light-emitting unit row are disposed adjacently. And the second R light-emitting unit R2 is located in a first light-emitting unit column, the second G light-emitting unit G2 is located in a second light-emitting unit column, the second B light-emitting unit B2 is located in a third light-emitting unit column, and the third G light-emitting unit G3 is located in a fourth light-emitting unit column, where the first light-emitting unit column, the second light-emitting unit column, the third light-emitting unit column and the fourth light-emitting unit column are sequentially arranged in a row direction. In the column direction, the second G light-emitting unit G2 and the third G light-emitting unit G3 are arranged adjacently, that is, in the column direction, the second G light-emitting unit G2 and the third G light-emitting unit G3 are not spaced by the light-emitting unit row. Correspondingly, in the pixel structure arrangement, the pixel driving circuits in the first pixel islands are sequentially arranged in the row direction. Here, the aperture ratio of the first display area may reach 72.04%, and the light transmittance may reach 38.84% under the arrangement of the pixel structure of the first pixel islands in the first display area.

Figure 6:
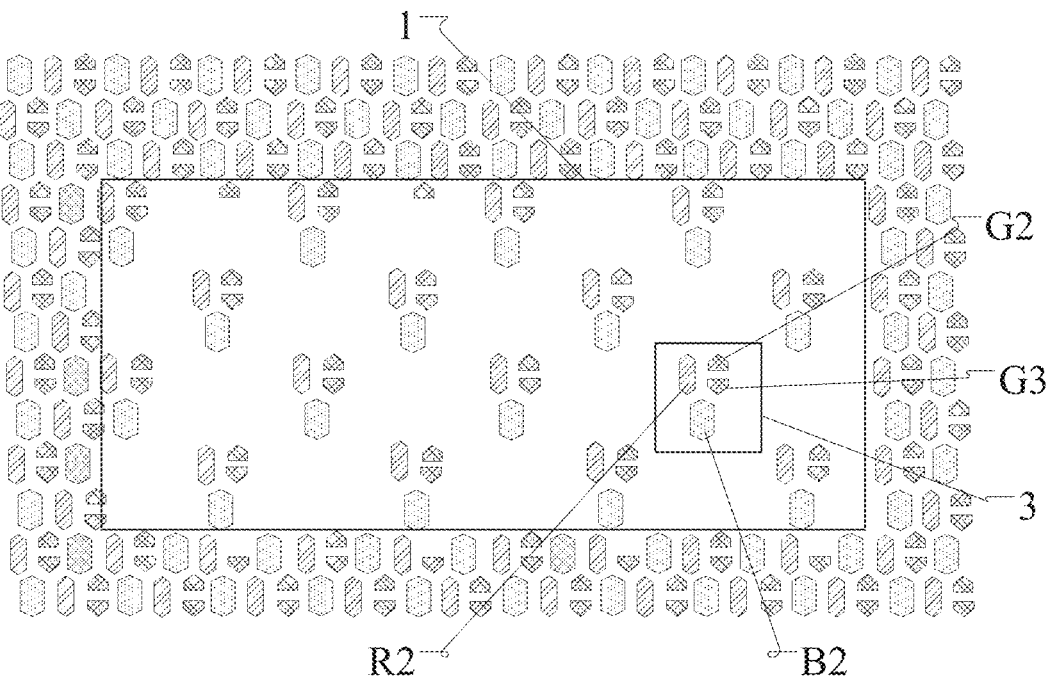
FIG. 6 is a schematic structural diagram of a display panel according to yet another exemplary embodiment of the present disclosure.

For another example, FIG. 6 shows a schematic structural diagram of a display panel according to another exemplary embodiment of the present disclosure. The second R light-emitting unit R2, the second G light-emitting unit G2, and the third G light-emitting unit G3 are located in a first light-emitting unit row. Here, since the area of the orthographic projection of the second G light-emitting unit G2 on the base substrate and the area of the third G light-emitting unit G3 on the base substrate are small, the second G light-emitting unit G2 and the third G light-emitting unit G3 may be considered to be located in the same light-emitting unit row. The second B light-emitting units B2 is located in a second light-emitting unit row. The first light-emitting unit row and the second light-emitting unit row are arranged adjacently. The second R light-emitting unit R2 is located in a first light-emitting unit column, the second B light-emitting unit B2 is located in a second light-emitting unit column, and the second G light-emitting unit G2 and the third G light-emitting unit G3 are located in a third light-emitting unit column, where the second light-emitting unit column is located between the first light-emitting unit column and the third light-emitting unit column. Correspondingly, in the pixel structure arrangement, the pixel driving circuits in the first pixel islands are arranged in a two-by-two array. Here, the aperture ratio of the first display area may reach 75.67%, and the light transmittance may reach 40.8% under the arrangement of the pixel structure of the first pixel islands in the first display area.

As shown in FIGS. 3, 4, 5 and 6, the first pixel island 3 may include one RGGB pixel unit, and one RGGB pixel unit may include one red (R) sub-pixel, two green (G) sub-pixels, and one blue (B) sub-pixel. It should be understood that, in other exemplary embodiments, the first pixel island 3 may also include other numbers of pixel units, each of the pixel units may also include other numbers of sub-pixel units, and the sub-pixel units in the same pixel unit may also be arranged in other forms. For example, the pixel units in the first pixel islands may be distributed in a Real RGB arrangement.

Figure 7:
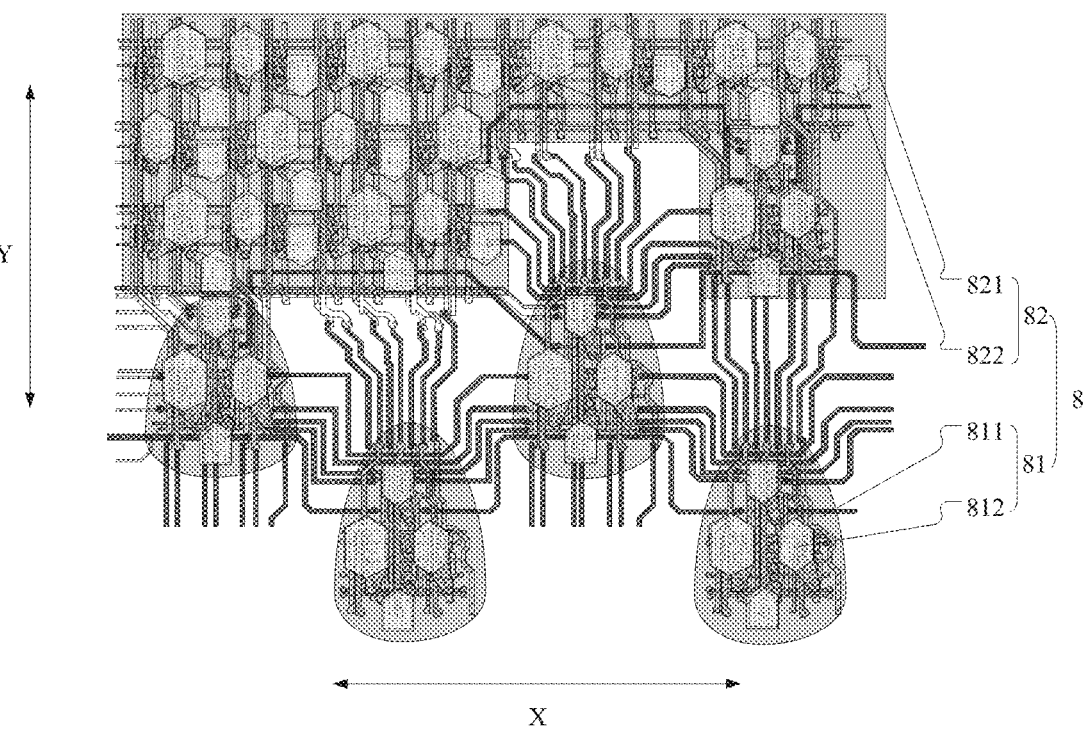
FIG. 7 is a schematic structural diagram of a display panel according to yet another exemplary embodiment of the present disclosure.

In the exemplary embodiments, FIG. 7 shows a schematic structural diagram of a display panel according to another exemplary embodiment of the present disclosure. The display panel may further include a color filter layer 8 which may be located on a side of the first pixel islands 3 away from the base substrate 0. The color filter layer 8 may include a plurality of first structural portions 81 in the first display area, the plurality of first structural portions 81 are arranged in a one-to-one correspondence with the plurality of the first pixel islands 3, and the orthographic projection of the first structural portion 81 on the base substrate covers the orthographic projection of the corresponding first pixel island 3 on the base substrate. In addition, at least one side or corner of the orthographic projection of the first structural portion 81 on the base substrate is arc-shaped. The first structural portions 81 may include: first light-shielding portions 811 and first filter portions 812. The first light-shielding portions 811 may be formed by a layer of light-shielding material, for example, a black photoresist layer. A color filter film may be used for the first filter portions 812. At least one opening is formed on the first light-shielding portions 811 and arranged in a one-to-one correspondence with the first light-emitting units in the first pixel islands 3. The first filter portion 812 is located in the opening of the first light-shielding portion 811, the orthographic projection of the first filter portion 812 on the base substrate may be completely overlapped with the orthographic projection of the corresponding opening of the first light-shielding portion 811 on the base substrate, and the orthographic projection of the first filter portion 812 on the base substrate may cover the orthographic projection of the corresponding first light-emitting unit on the base substrate. The color of the first filter portion 812 may be the same as the color of the corresponding light-emitting unit. Here, the conductive structures of the pixel driving circuits in the first pixel islands may be shielded by the first structural portions 81 with such an arrangement, thereby avoiding the glare phenomenon caused by the diffraction of elongated wires in the pixel driving circuits. As shown in FIG. 7, the orthographic projection of the first structural portion 81 on the base substrate may be in the shape of a water drop. It should be understood that in other exemplary embodiments, the orthographic projection of the first structural portion 81 on the base substrate may also be in other structures such as a rounded rectangle. The plurality of first structural portions 81 may be spaced apart from each other, so as to increase the transmittance of the first display area. Here, the first filter portions 812 can prevent the display panel from reflecting light. It should be understood that, in other exemplary embodiments, the openings in first light-shielding portions 811 may also be provided without a filter portion, and a polarizer may be applied to the display panel to avoid light reflection.

In the exemplary embodiments, as shown in FIG. 7, the color filter layer 8 may further include second structural portions 82 located in the second display area 2, and the second structural portions 82 may include: second light-shielding portions 821 and second filter portions 822, where the second light-shielding portions 821 may be formed by a layer of light-shielding material, for example, a black photoresist layer. A color filter film may be used for the second filter portions 822. A plurality of openings are formed on the second light-shielding portions 821 and arranged in a one-to-one correspondence with the second light-emitting units. The second filter portion 822 is located in the opening of the second light-shielding portion 821, the orthographic projection of the second filter portion 822 on the base substrate may be completely overlapped with the orthographic projection of the corresponding opening of the second light-shielding portion 821 on the base substrate, and the orthographic projection of the second filter portion 822 on the base substrate may cover the orthographic projection of the corresponding second light-emitting unit on the base substrate. The second light-shielding portions 821 and the first light-shielding portions 811 may be integrally formed, that is, the second light-shielding portions 821 and the first light-shielding portions 811 may be formed through a single patterning process. The filter portions having the same color, among the first filter portions 812 and the second filter portions 822, may be formed by a single patterning process. The second structural portions 82 may be an integral structure and cover the second display area. Similarly, the second filter portions 822 can also prevent the display panel from reflecting light.

Figure 8:
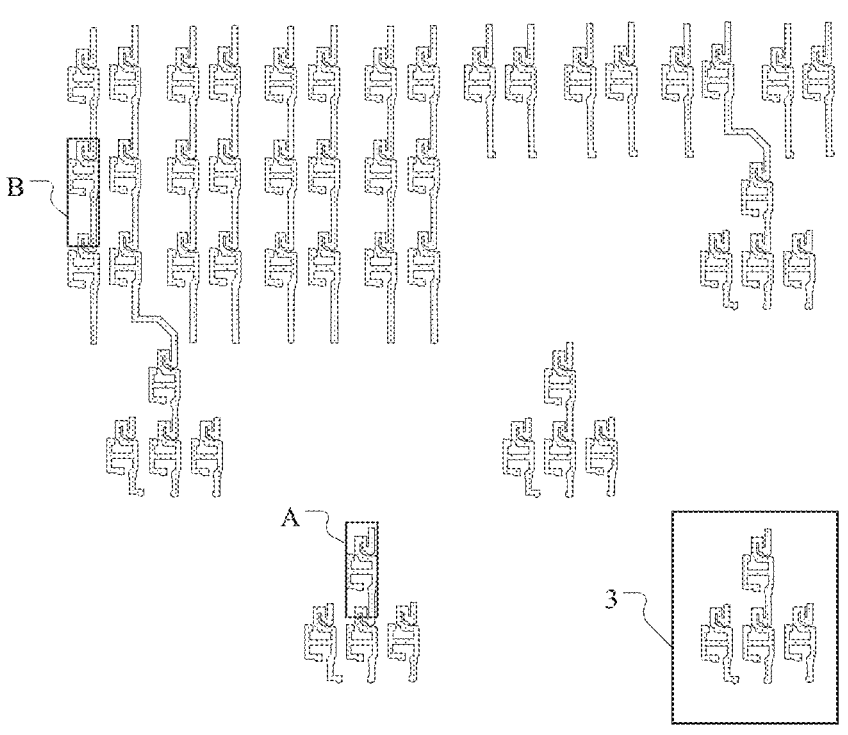
FIG. 8 is a structural layout of an active layer in FIG. 3.
Figure 9:
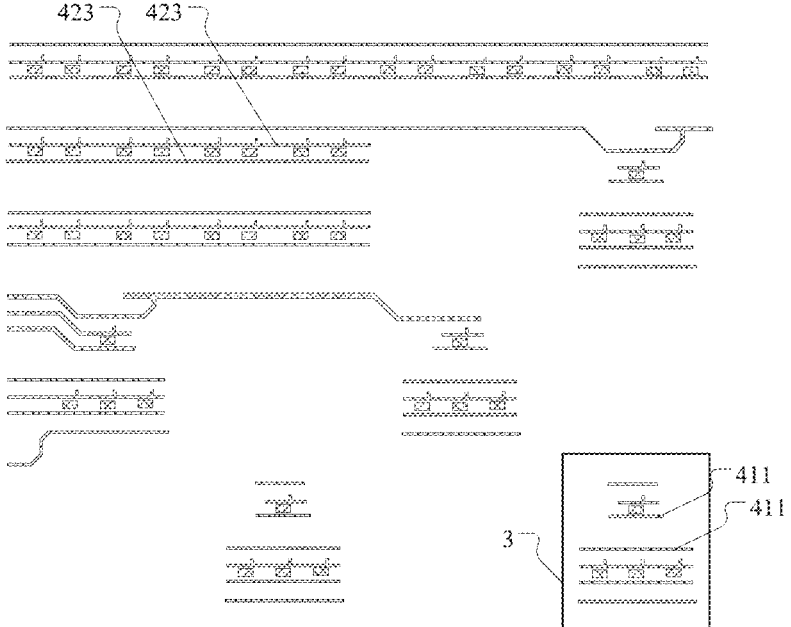
FIG. 9 is a structural layout of a first gate layer in FIG. 3.
Figure 10:
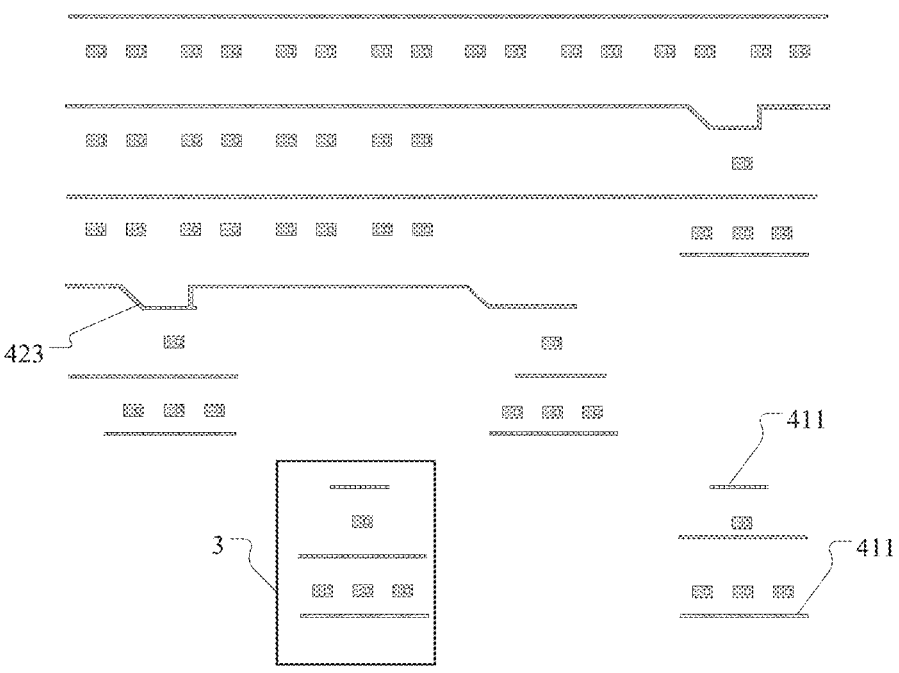
FIG. 10 is a structural layout of a second gate layer in FIG. 3.
Figure 11:
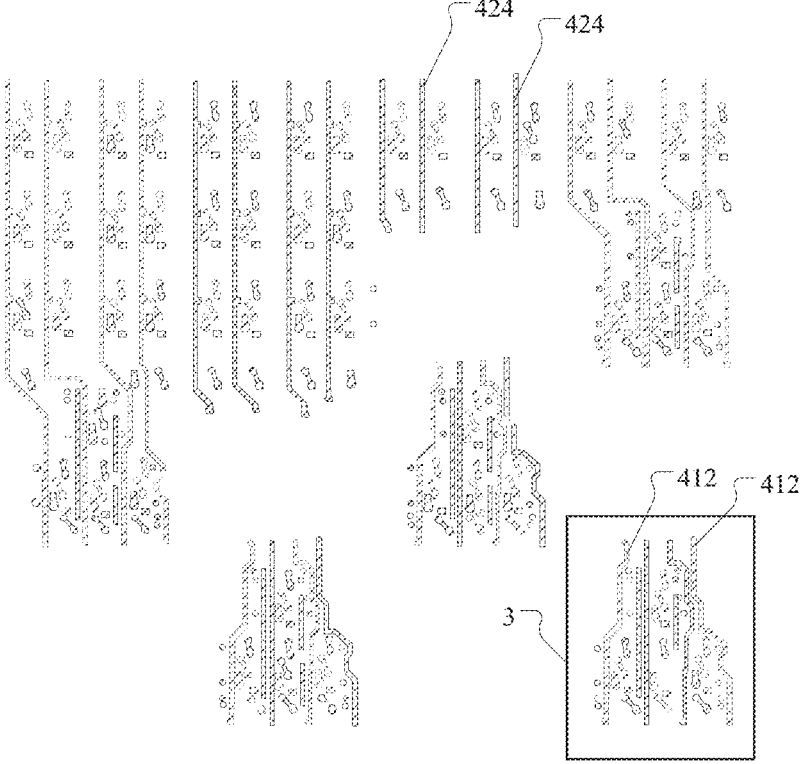
FIG. 11 is a structural layout of a first source-drain layer in FIG. 3.
Figure 12:
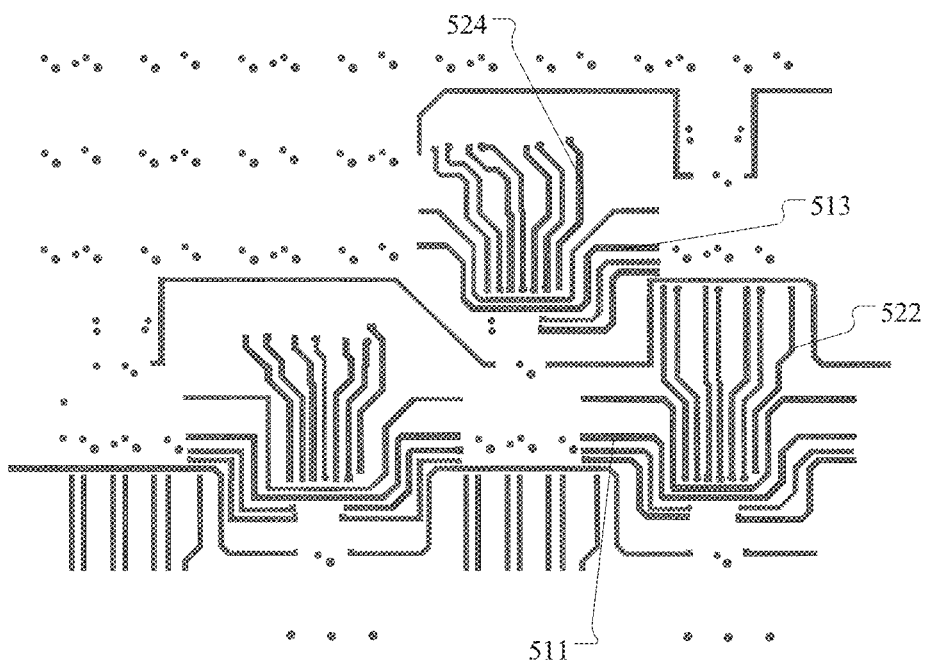
FIG. 12 is a structural layout of a transparent conductive layer in FIG. 3.
Figure 13:
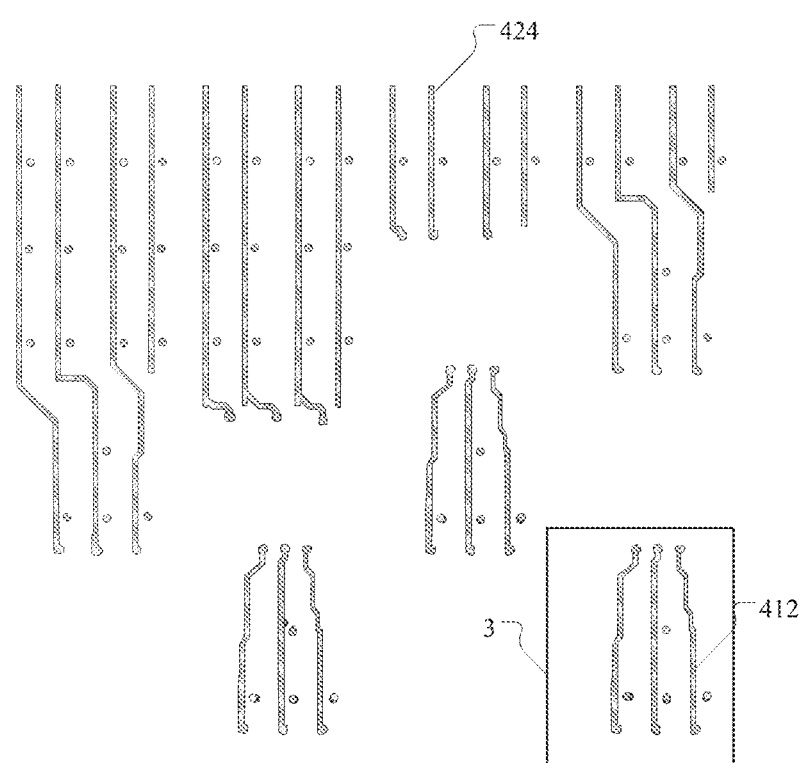
FIG. 13 is a structural layout of a second source-drain layer in FIG. 3.
Figure 14:
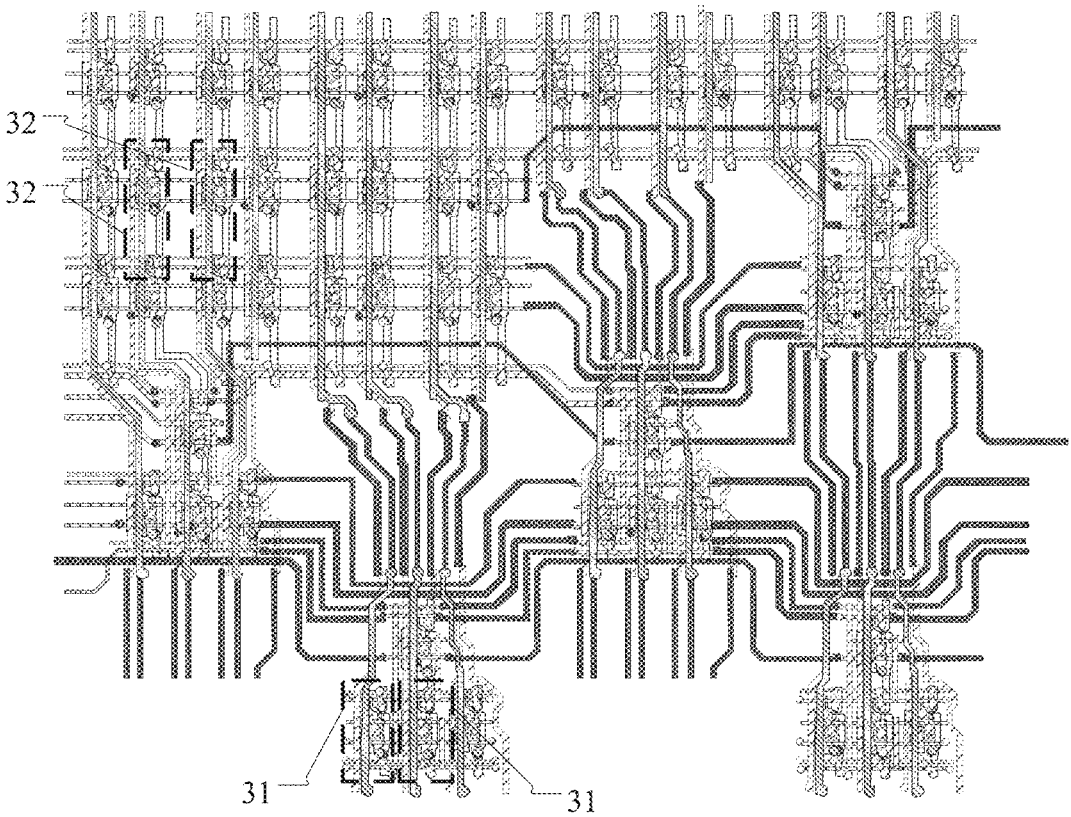
FIG. 14 is a layout of a stacked structure of the active layer, the first gate layer, the second gate layer, the first source-drain layer, the transparent conductive layer, and the second source-drain layer in FIG. 3.

The display panel may include circuit layers for forming the pixel driving circuits, and the circuit layers may include an active layer, a first gate layer, a second gate layer, a first source-drain layer, a transparent conductive layer, and a second source-drain layer, as shown in FIGS. 8-14. FIG. 8 shows a structural layout of an active layer in FIG. 3, FIG. 9 shows a structural layout of a first gate layer in FIG. 3, FIG. 10 shows a structural layout of a second gate layer in FIG. 3, FIG. 11 shows a structural layout of a first source-drain layer in FIG. 3, FIG. 12 shows a structural layout of a transparent conductive layer in FIG. 3, FIG. 13 shows a structural layout of a second source-drain layer in FIG. 3, and FIG. 14 shows a layout of a stacked structure of the active layer, the first gate layer, the second gate layer, the first source-drain layer, the transparent conductive layer, and the second source-drain layer in FIG. 3. The base substrate, the active layer, the first gate layer, the second gate layer, the first source-drain layer, the transparent conductive layer, and the second source-drain layer are stacked in sequence, in which other film layers may also be provided between the above adjacent film layers, for example, an insulating layer may be provided between the above adjacent film layers. The first signal line segments 41 and the second signal line segments 42 may be located in the first source-drain layer or the second source-drain layer, and the transparent bridging line segments 5 may be located in the transparent conductive layer.

In the exemplary embodiments, as shown in FIG. 14, the above the active layer, the first gate layer, the second gate layer, the first source-drain layer, the transparent conductive layer, and the second source-drain layer may form the above first pixel driving circuits 31 and second pixel driving circuits 32. The area of the orthographic projection of the first pixel driving circuit 31 on the base substrate may be smaller than the area of the orthographic projection of the second pixel driving circuit 32 on the base substrate, in this way, the light-shielding area of the first display area 1 by the first pixel driving circuit 31 can be reduced, thereby improving the light transmittance of the first display area 1. It should be noted that the area of the orthographic projection of the pixel driving circuit on the base substrate may be understood as the area of an externally tangent rectangle of the active layer portion of the pixel driving circuit, and the length and width of the externally tangent rectangle are parallel to the row and column directions, respectively. For example, as shown in FIG. 8, the externally tangent rectangle corresponding to the first pixel driving circuit 31 is A, and the externally tangent rectangle corresponding to the second pixel driving circuit 32 is B.

In the exemplary embodiments, in at least one direction, a gap between the orthographic projections of two adjacent first pixel driving circuits 31 on the base substrate is smaller than a gap between the orthographic projections of two adjacent second pixel driving circuits 32 on the base substrate. For example, as shown in FIG. 14, in the row direction, the gap between the orthographic projections of two adjacent first pixel driving circuits 31 on the base substrate is smaller than the gap between the orthographic projections of two adjacent second pixel driving circuits 32 on the base substrate, in this way, the layout area of the pixel driving circuits in the first pixel islands can be further reduced, thereby increasing the light transmittance of the first display area. It should be noted that the distance between the adjacent pixel driving circuits in the row direction may be understood as a distance between adjacent edges of the externally tangent rectangles of the adjacent pixel driving circuits in the row direction.

In the exemplary embodiments, in the same first pixel island, the orthographic projection of at least one of the first light-emitting units on the base substrate is at least partially overlapped with the orthographic projection of the corresponding first pixel driving circuit on the base substrate, in this way, the area of the light-transmitting region of the first display area can be increased, thereby increasing the light transmittance of the first display area. For example, as shown in FIG. 3, the orthographic projection of the second R light-emitting unit R2 on the base substrate is at least partially overlapped with the orthographic projection of the corresponding first pixel driving circuit on the base substrate; the orthographic projection of the second B light-emitting unit B2 on the base substrate is at least partially overlapped with the orthographic projection of the corresponding first pixel driving circuit on the base substrate; and the orthographic projection of the second G light-emitting unit G2 on the base substrate is at least partially overlapped with the orthographic projection of the corresponding first pixel driving circuit on the base substrate.

Figures 15, 16:
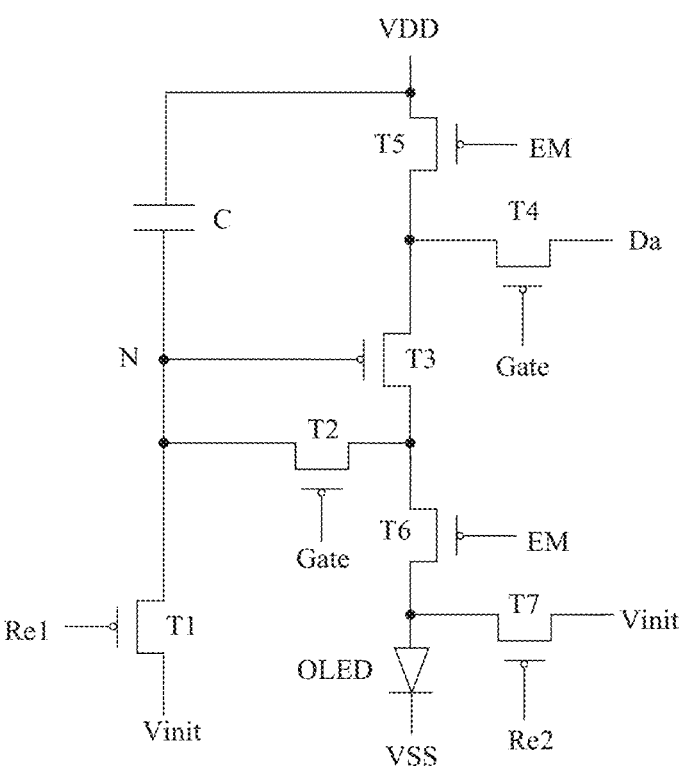
FIG. 15 is a schematic diagram of a circuit structure of a pixel driving circuit in a display panel according to an exemplary embodiment of the present disclosure.
FIG. 16 is a timing diagram of each node in a driving method of the pixel driving circuit of FIG. 15.

FIG. 15 is a schematic diagram of a circuit structure of a pixel driving circuit in a display panel according to an exemplary embodiment of the present disclosure, in which this circuit structure may be adoptable by both the first pixel driving circuit and the second pixel driving circuit. The pixel driving circuit may include: a first transistor T1, a second transistor T2, a driving transistor T3, a fourth transistor T4, a fifth transistor T5, a sixth transistor T6, a seventh transistor T7, and a capacitor C. Here, a first electrode of the first transistor T1 is connected to a node N, a second electrode thereof is connected to an initial signal terminal Vinit, and a gate electrode thereof is connected to a reset signal terminal Re1; a first electrode of the second transistor T2 is connected to a first electrode of the driving transistor T3, a second electrode thereof is connected to the node N, and a gate electrode thereof is connected to a gate driving signal terminal Gate; a gate electrode of the driving transistor T3 is connected to the node N; a first electrode of the fourth transistor T4 is connected to a data signal terminal Da, a second electrode thereof is connected to a second electrode of the driving transistor T3, and a gate electrode thereof is connected to the gate driving signal terminal Gate; a first electrode of the fifth transistor T5 is connected to a first power supply signal terminal VDD, a second electrode thereof is connected to the second electrode of the driving transistor T3, and a gate electrode thereof is connected to an enable signal terminal EM; a first electrode of the sixth transistor T6 is connected to the first electrode of the driving transistor T3, a gate electrode thereof is connected to the enable signal terminal EM; and a first electrode of the seventh transistor T7 is connected to the initial signal terminal Vinit, the second electrode thereof is connected to the second electrode of the sixth transistor T6, and the gate electrode thereof is connected to a reset signal terminal Re2. The capacitor C is connected between the gate electrode of the driving transistor T3 and the first power supply signal terminal VDD. The pixel driving circuit may be connected to a light-emitting unit Organic Light-Emitting Diode (OLED) for driving the light-emitting unit OLED to emit light, and the light-emitting unit OLED may be connected between the second electrode of the sixth transistor T6 and the second power supply terminal VSS. Here, the transistors T1-T7 may be P-type transistors.

FIG. 16 is a timing diagram of each node in a driving method of the pixel driving circuit of FIG. 15, where Gate represents the timing of the gate drive signal terminal Gate, Re1 represents the timing of the reset signal terminal Re1, Re2 represents the timing of the reset signal terminal Re2, EM represents the timing of the enable signal terminal EM, and Da represents the timing of the data signal terminal Da. The driving method of the pixel driving circuit may include a reset phase t1, a compensation phase t2, and a light-emitting phase t3. In the reset phase t1, the reset signal terminal Re1 outputs a low level signal, the first transistor T1 is turned on, and the initial signal terminal Vinit inputs an initial signal to the node N. In the compensation phase t2, the reset signal terminal Re2 and the gate driving signal terminals Gate output a low-level signal, the fourth transistor T4, the second transistor T2, and the seventh transistor T7 are turned on, and at the same time, the data signal terminal Da outputs a driving signal to write voltage (Vdata+Vth) to the node N, where Vdata is a voltage of the driving signal and Vth is a threshold voltage of the driving transistor T3, and then the initial signal terminal Vinit inputs the initial signal to the second electrode of the sixth transistor T6. In the light-emitting phase t3, the enable signal terminal EM outputs a low-level signal, the sixth transistor T6 and the fifth transistor T5 are turned on, and the driving transistor T3 emits light under the action of the voltage (Vdata+Vth) stored in the capacitor C. According to the output current formula $I=(\mu WCox/2L)(Vgs-Vth)^2$ of the driving transistor, where $\mu$ is the carrier mobility, Cox is the gate capacitance per unit area, W is the width of a channel of the driving transistor, L is the length of the channel of the driving transistor, Vgs is the gate-source voltage difference of the driving transistor, and Vth is the threshold voltage of the driving transistor, the output current of the driving transistor in the pixel driving circuit according to the present disclosure is represented by the formula: $I=(\mu WCox/2L)(Vdata+Vth-Vdd-Vth)^2$. Therefore, the effect of the threshold value of the driving transistor on the output current thereof can be avoided by the pixel driving circuit.

The structure of the first pixel island is described in detail below using a partial enlarged view of the location of the first pixel island in the exemplary embodiments.

Figure 17:
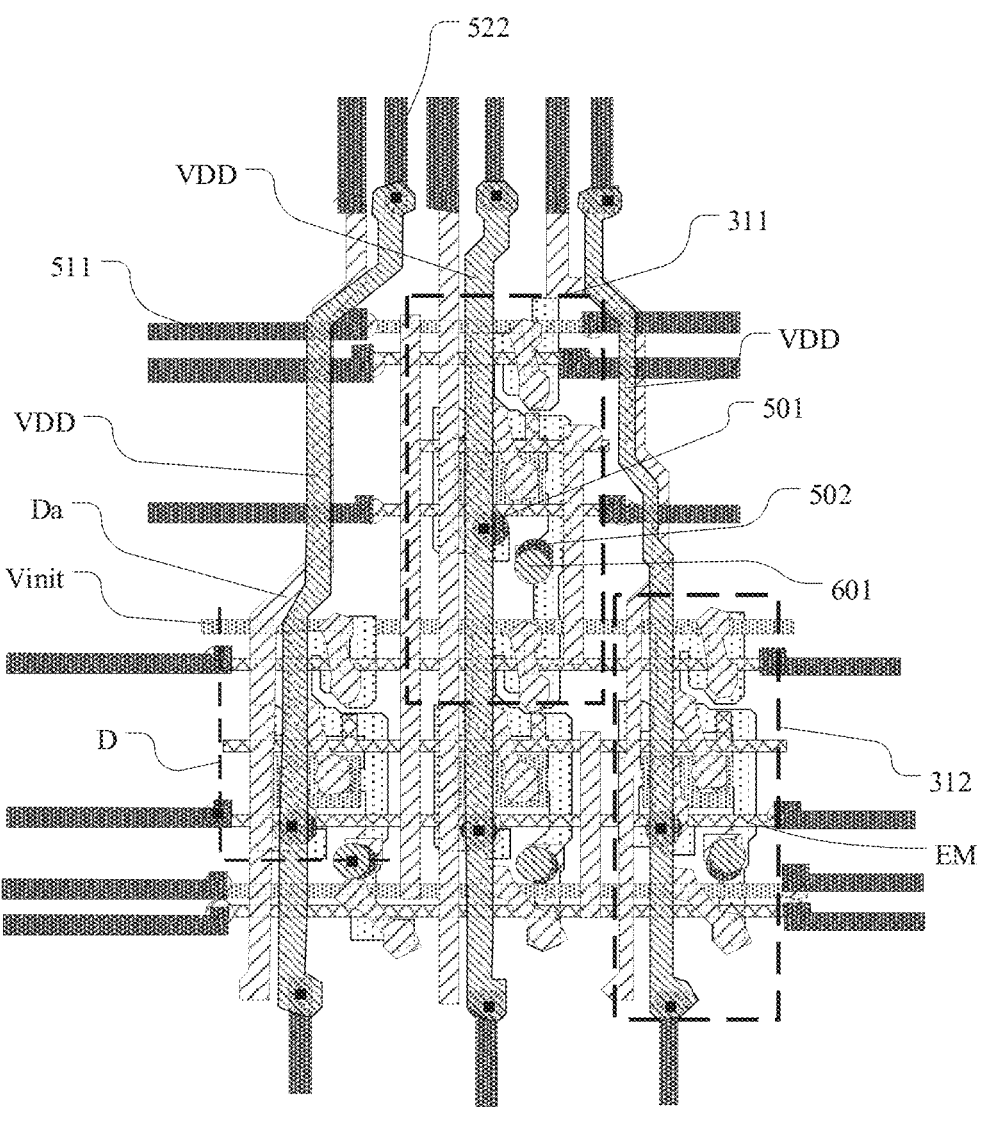
FIG. 17 is a partial enlarged view of a first pixel island in a region C in FIG. 3.
Figure 18:
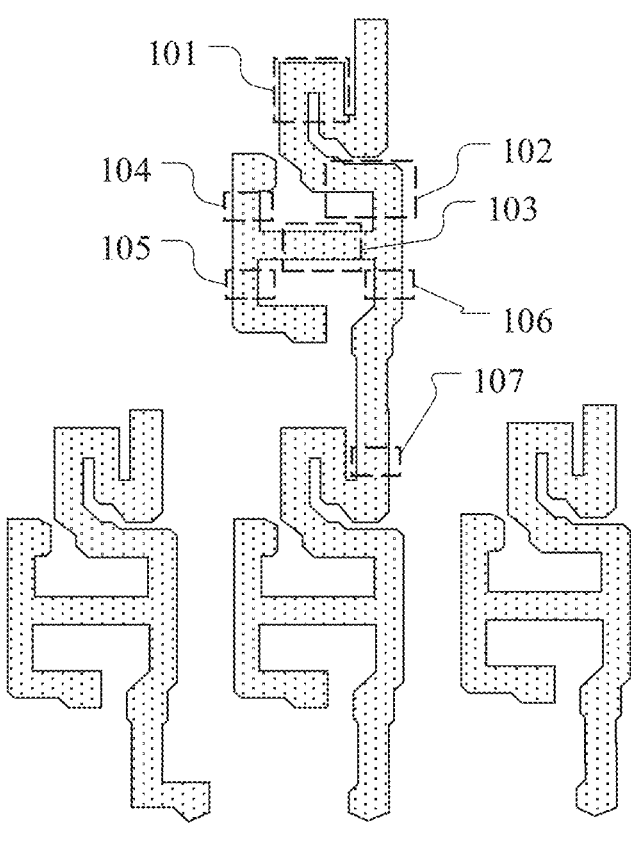
FIG. 18 is a structural layout of an active layer in FIG. 17.
Figure 19:
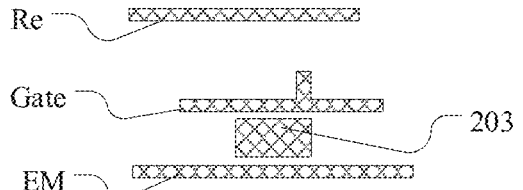
FIG. 19 is a structural layout of a first gate layer in FIG. 17.
Figure 19:
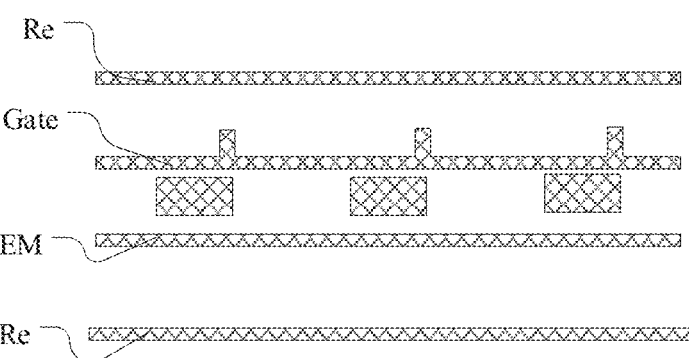
Figure 20:
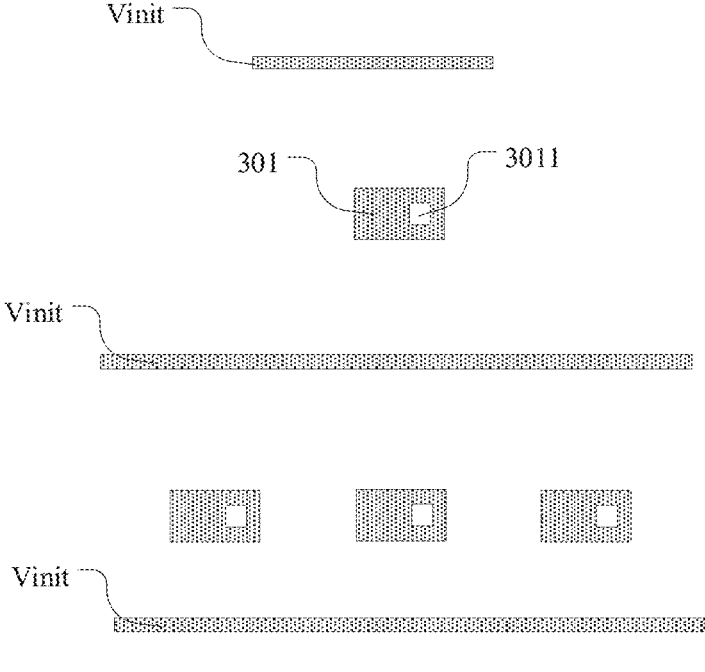
FIG. 20 is a structural layout of a second gate in FIG. 17.
Figure 21:
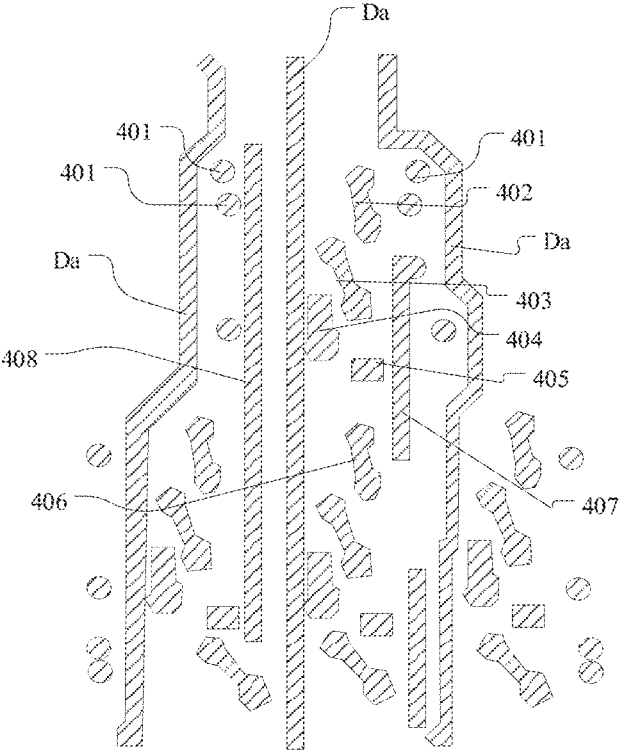
FIG. 21 is a structural layout of a first source-drain layer in FIG. 17.
Figure 22:
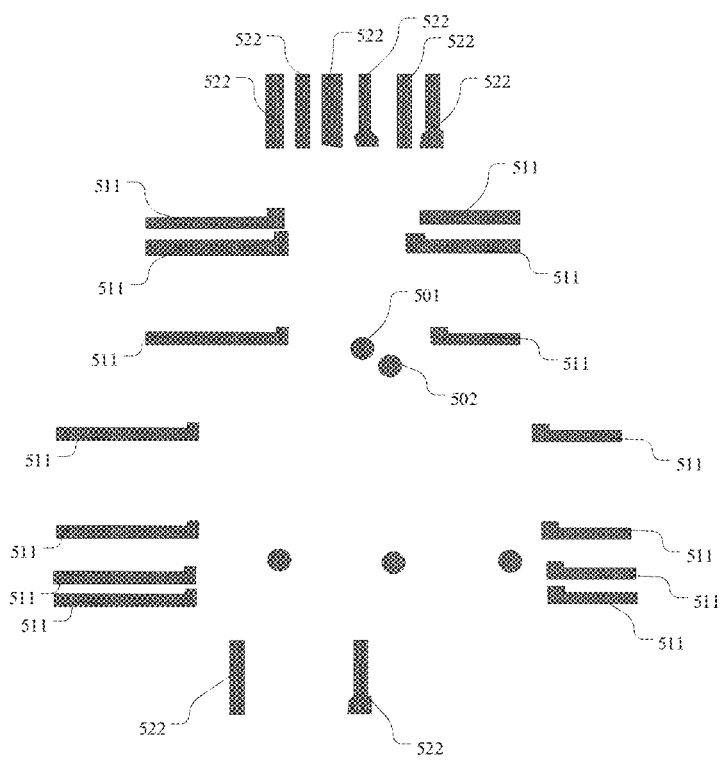
FIG. 22 is a structural layout of a transparent conductive layer in FIG. 17.
Figure 23:
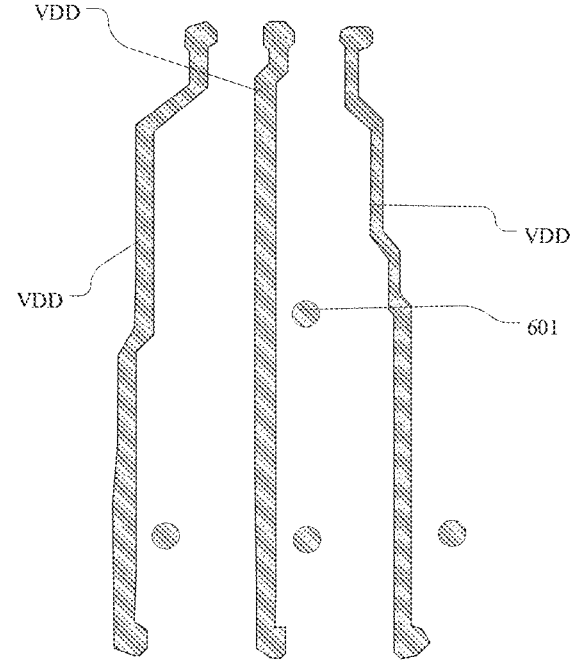
FIG. 23 is a structural layout of a second source-drain layer in FIG. 17.
Figure 24:
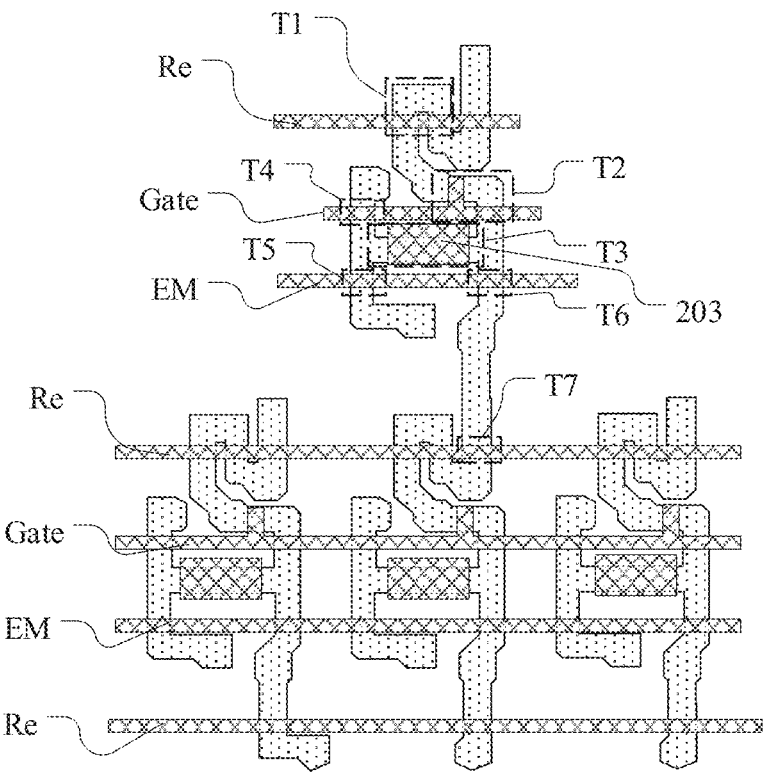
FIG. 24 is a stacked layout of the active layer and the first gate layer in FIG. 17.
Figure 25:
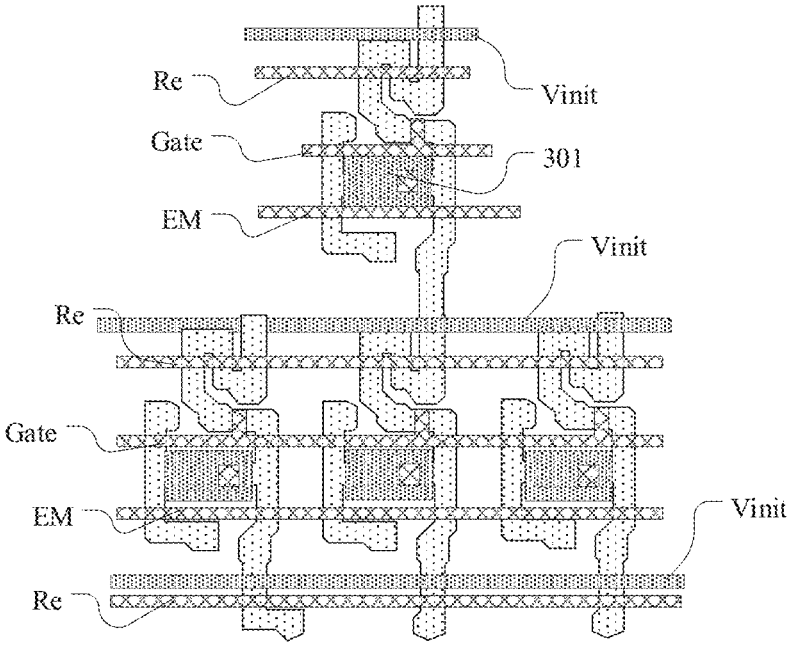
FIG. 25 is a stacked layout of the active layer, the first gate layer, and the second gate layer in FIG. 17.
Figure 26:
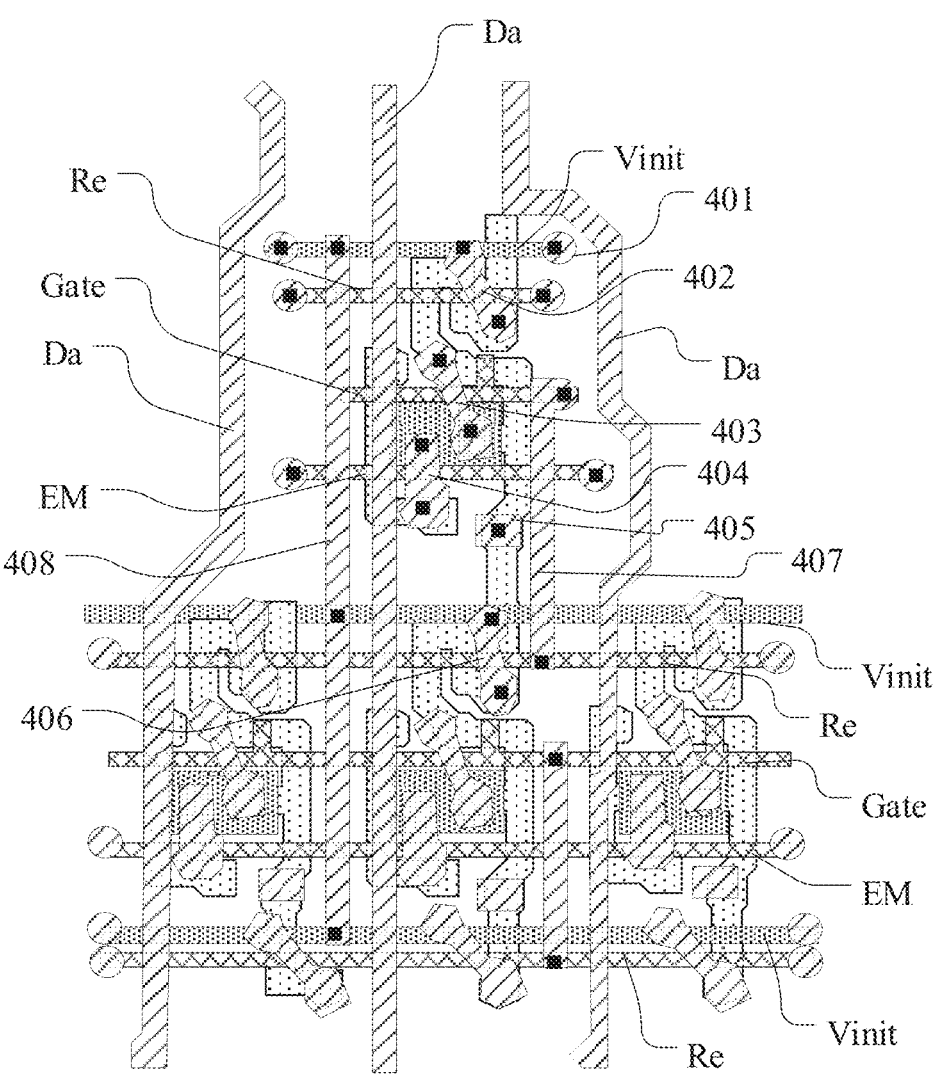
FIG. 26 is a stacked layout of the active layer, the first gate layer, the second gate layer, and the first source-drain layer in FIG. 17.
Figure 27:
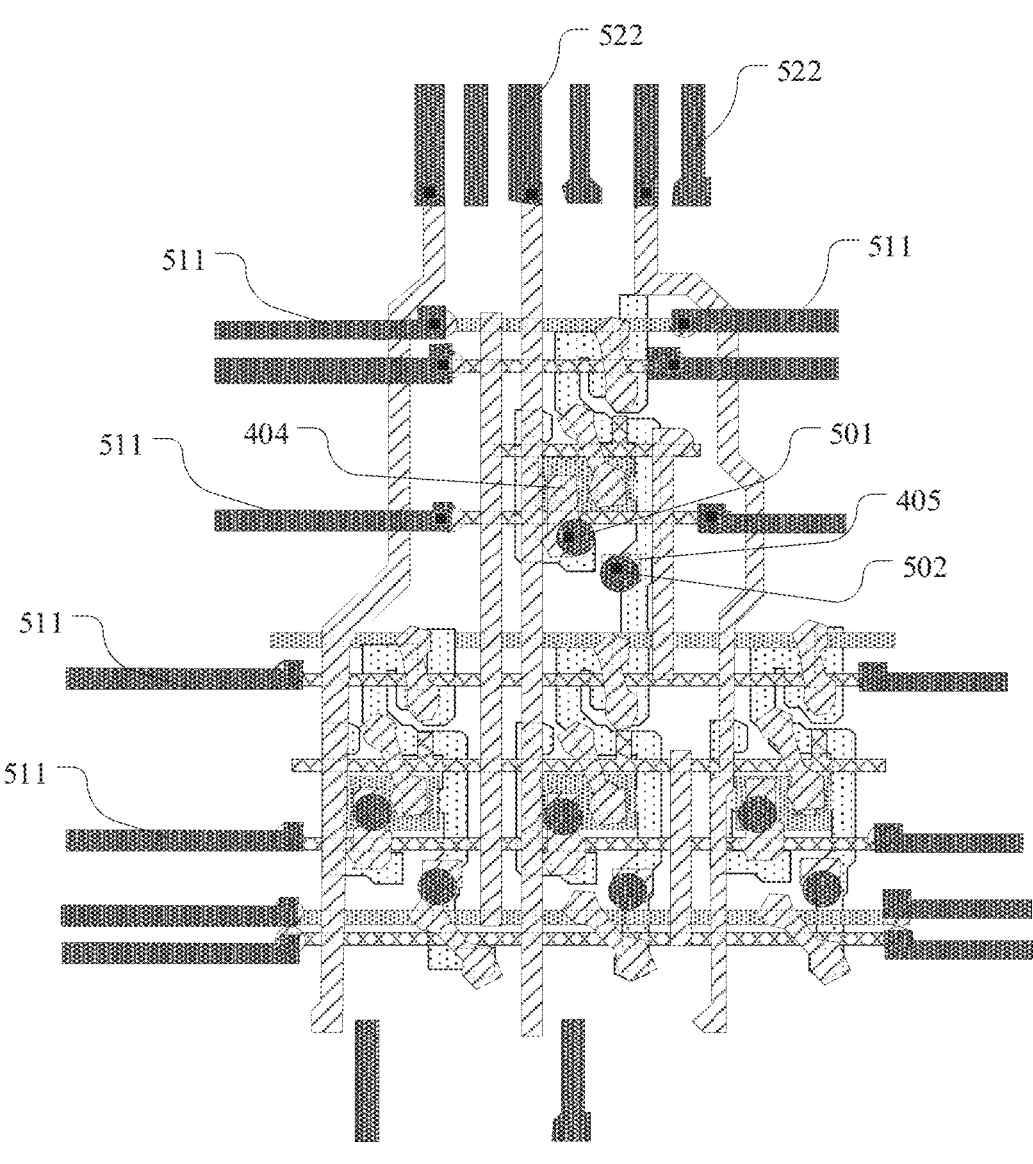
FIG. 27 is a stacked layout of the active layer, the first gate layer, the second gate layer, the first source-drain layer, and the transparent conductive layer in FIG. 17.

As shown in FIGS. 17-27, FIG. 17 is a partial enlarged view of a first pixel island in a region C in FIG. 3, FIG. 18 is a structural layout of an active layer in FIG. 17, FIG. 19 is a structural layout of a first gate layer in FIG. 17, FIG. 20 is a structural layout of a second gate in FIG. 17, FIG. 21 is a structural layout of a first source-drain layer in FIG. 17, FIG. 22 is a structural layout of a transparent conductive layer in FIG. 17, FIG. 23 is a structural layout of a second source-drain layer in FIG. 17, FIG. 24 is a stacked layout of the active layer and the first gate layer in FIG. 17, FIG. 25 is a stacked layout of the active layer, the first gate layer, and the second gate layer in FIG. 17, FIG. 26 is a stacked layout of the active layer, the first gate layer, the second gate layer, and the first source-drain layer in FIG. 17, and FIG. 27 is a stacked layout of the active layer, the first gate layer, the second gate layer, the first source-drain layer, and the transparent conductive layer in FIG. 17.

As shown in FIGS. 17, 18 and 24, the active layer may include a first active portion 101, a second active portion 102, a third active portion 103, a fourth active portion 104, a fifth active portion 105, a sixth active portion 106 and a seventh active portion 107. The first active portion 101 is configured to form a channel portion of the first transistor T1, the second active portion 102 is configured to form a channel portion of the second transistor T2, the third active portion 103 is configured to form a channel portion of the driving transistor T3, the fourth active portion 104 is configured to form a channel portion of the fourth transistor T4, the fifth active portion 105 is configured to form a channel portion of the fifth transistor T5, the sixth active portion 106 is configured to form a channel portion of the sixth transistor T6, and the seventh active portion 107 is configured to form a channel portion of the seventh transistor T7.

As shown in FIGS. 17, 19 and 24, the first gate layer may include a reset signal line Re, a gate driving signal line Gate, an enable signal line EM, and a conductive portion 203. The reset signal line Re, the gate driving signal line Gate, and the enable signal line EM may form the first sub-signal line segment. The reset signal line Re may be used to provide the reset signal terminal Re1 and the reset signal terminal Re2 in FIG. 15. As shown in FIGS. 19 and 24, the first pixel island 3 includes three reset signal lines Re, and the reset signal line Re in the middle position may be configured to provide the reset signal terminal Re2 in the upper row of the pixel driving circuit and the reset signal terminal Re1 in the lower row of the pixel driving circuit in the first pixel island. The gate driving signal line Gate may be configured to provide the gate driving signal terminal in FIG. 15. The enable signal line EM may be configured to provide the enable signal terminal in FIG. 15. A partial structure of the reset signal lines may be configured to form the gate electrodes of the first transistor T1 and the seventh transistor T7. A partial structure of the gate driving signal line Gate may be configured to form the gate electrodes of the second transistor T2 and the fourth transistor T4. A partial structure of the enable signal line EM may be configured to form the gate electrodes of the fifth transistor T5 and the sixth transistor T6. The conductive portion 203 may be configured to form the gate electrode of the driving transistor T3 and an electrode of the capacitor C.

As shown in FIGS. 17, 20 and 25, the second gate layer may include an initial signal line Vint and a conductive portion 301. The initial signal line Vint may be configured to provide the initial signal terminal in FIG. 15. The conductive portion 301 may be configured to form the other electrode of the capacitor C, where an opening 3011 is formed on the conductive portion 301.

As shown in FIGS. 17, 21 and 26, the first source-drain layer may include data lines Da, a plurality of conductive portions 401, a conductive portion 402, a conductive portion 403, a conductive portion 404, a conductive portion 405, and a conductive portion 406. The data lines Da may form the second sub-signal line segments and configured to provide the data signal terminal in FIG. 15. The plurality of conductive portions 401 may be connected to two ends of the reset signal line Re, two ends of the enable signal line EM, two ends of part of the gate driving signal line Gate, and two ends of part of the initial signal line Vint through via holes (black squares in the drawings) respectively. The conductive portion 402 may be configured to connect the initial signal line Vint and the active layer on one side of the first active portion 101 through via holes respectively, so as to connect the second electrode of the first transistor T1 and the initial signal terminal. The conductive portion 403 may be configured to connect the active layer on one side of the first active portion 101 and the conductive portion 203 through via holes respectively, so as to connect the first electrode of the first transistor T1 and the gate electrode of the driving transistor T3. Here, the via holes for connecting the conductive portion 403 and the conductive portion 203 penetrate through the opening 3011 on the conductive portion 301 to prevent the conductive portion 403 from being short-circuited with the conductive portion 301. The conductive portion 404 is configured to connect the conductive portion 301 and the active layer on one side of the fifth active portion 105 through via holes respectively, so as to connect the first electrode of the fifth transistor T5 and an electrode of the capacitor C. The conductive portion 405 may be configured to connect the active layer on one side of the seventh active portion 107 through via holes, so as to connect the second electrode of the seventh transistor. The conductive portion 406 is configured to connect the initial signal line Vinit and the active layer on the side of the seventh active portion 107 through via holes respectively, so as to connect the first electrode of the seventh transistor T7 and the initial signal terminal.

As shown in FIGS. 17, 22 and 27, the transparent conductive layer may include a plurality of first sub-transparent bridging line segments 511, a plurality of second sub-transparent bridging line segments 522, a conductive portion 501 and a conductive portion 502. The conductive portion 501 is connected to the conductive portion 404 through a via hole, and the conductive portion 502 is connected to the conductive portion 405 through a via hole. The plurality of first sub-transparent bridging line segments 511 may be respectively connected to the initial signal lines, the gate driving signal lines, the reset signal lines, the enable signal lines and other signal lines extending in the row direction through the conductive portions 401. The second sub-transparent bridging line segments 522 may be connected to the data signal lines through the conductive portions 401.

As shown in FIGS. 17 and 23, the second source-drain layer may include power supply lines VDD and a conductive portion 601. The power supply lines VDD may be connected to the second sub-transparent bridging line segments 522 through via holes. In addition, the power supply lines VDD may be connected to the conductive portion 501 through via holes, so as to connect the first power supply terminal VDD, the fifth transistor T5 and an electrode of the capacitor in FIG. 15. The conductive portion 601 may be connected to the conductive portion 502 through via holes, and the conductive portion 601 may be configured to connect the anode of the light-emitting unit. The power supply lines VDD may form the second sub-signal line segments.

As shown in FIGS. 17, 21 and 26, the first source-drain layer may further include a first connection line 407. The first connection line 407 may be connected to the gate driving signal line Gate in the upper row of the pixel driving circuit and the reset signal line Re in the lower row of the pixel driving circuit, respectively, through via holes, where the gate driving signal line Gate in the upper row of the pixel driving circuit may provide a gate driving signal to the first transistor T1 in the upper row of the pixel driving circuit, and the reset signal line Re in the lower row of the pixel driving circuit may provide a gate driving signal to the seventh transistor T7 in the upper row of the pixel driving circuit. As can be seen in FIG. 16, the reset signal terminal Re2 and the gate driving signal terminal Gate have the same timing. Therefore, the upper row of the pixel driving circuit may provide the gate driving signal through the reset signal line Re in the lower row, such that the gate driving signal line Gate in the current row of the pixel driving circuit may not be connected with other signal lines through transparent bridging line segments. In this way, on the one hand, the number of transparent bridging line segments in the first display area can be reduced, thereby increasing the light transmittance of the first display area; on the other hand, the layout space of the first display area can be increased to facilitate layout design.

As shown in FIGS. 17, 21 and 26, the first source-drain layer may further include a second connection line 408, and the second connection line 408 may be connected to the plurality of initial signal lines Vinit in the first pixel island, respectively, through via holes. In the same first pixel island, at least some of the initial signal lines Vinit may not be connected with other signal lines through transparent bridging line segments. For example, as shown in FIGS. 21 and 26, the first pixel island may include three initial signal lines Vinit, and one initial signal line Vinit in the middle may not be connected to other signal lines through the transparent bridging line segments. In this way, on the one hand, the number of the transparent signal lines in the first display area can be reduced, thereby increasing the light transmittance of the first display area; on the other hand, the load impedance (RC loading) of the initial signal lines Vinit can also be reduced.

As shown in FIG. 17, the first pixel island may include one first sub-pixel driving circuit 311 in the first row and three second sub-pixel driving circuits 312 in the second row, and the first sub-pixel driving circuit 311 and the second sub-pixel driving circuit 312 in the middle of the second row are located in the same column. The first pixel island may include three data lines Da, and the two data lines Da on both sides of the first pixel island may be bent and extended in the column direction, where the two data lines may be bent along the positions biased towards the first sub-pixel driving circuit 311. The first pixel islands may include three power supply lines VDD, and the two power supply lines VDD on both sides of the first pixel island may be bent and extended in the column direction, where the two power supply lines VDD may be bent along the positions biased towards the first sub-pixel driving circuit 311. In this way, the area of the first pixel island can be reduced, thereby increasing the light transmittance of the first display area. As shown in FIG. 17, the orthographic projections of the power supply line VDD and the data line Da on the same side of the first pixel island on the base substrate are at least partially overlapped, which may further reduce the area of the first pixel island.

Figure 28:
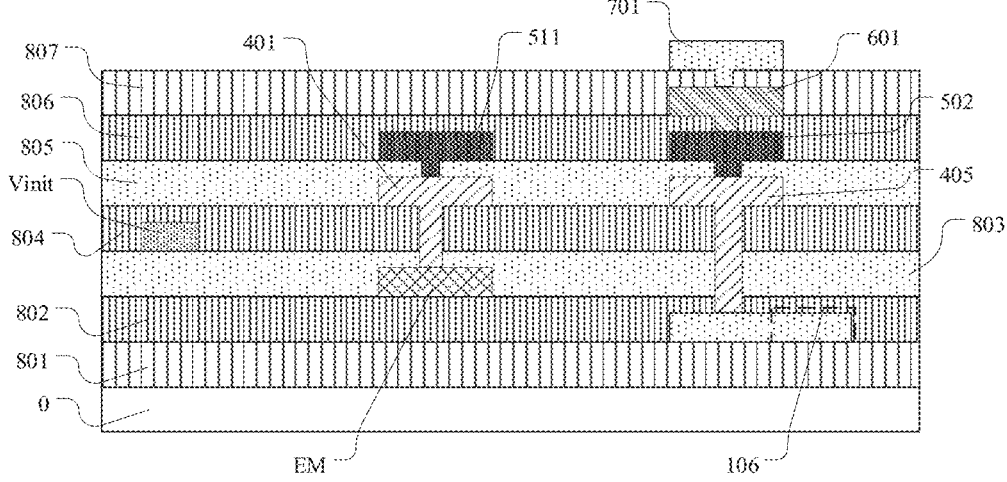
FIG. 28 is a cross-sectional view, which is taken along a dashed line D in FIG. 17, of a display panel according to an exemplary embodiment of the present disclosure.

FIG. 28 is a cross-sectional view, which is taken along a dashed line D in FIG. 17, of a display panel according to an exemplary embodiment of the present disclosure. This cross-sectional view shows part of the structure taken along the dashed line D in FIG. 17. The display panel may further include: a buffer layer 801, a first insulating layer 802, a second insulating layer 803, a dielectric layer 804, a passivation layer 805, a first planarization layer 806, a second planarization layer 807, and an anode layer 701. The base substrate 0, the buffer layer 801, the active layer, the first insulating layer 802, the first gate layer, the second insulating layer 803, the second gate layer, the dielectric layer 804, the first source-drain layer, the passivation layer 805, the transparent conductive layer, the first planarization layer 806, the second source-drain layer, the second planarization layer 807, and the anode layer 701 may be stacked in sequence.

The first insulating layer 802 and the second insulating layer 803 may be silicon oxide layers. The dielectric layer 804 may be silicon nitride layer. The passivation layer and the buffer layer may be silicon oxide layers. Each of the first gate layer, the second gate layer, the first source-drain layer, and the second source-drain layer may be formed by at least one metal layer. For example, each of the first gate layer, the second gate layer, the first source-drain layer, and the second source-drain layer may be formed by stacking a first titanium layer, an aluminum layer, and a second titanium layer in sequence. The transparent conductive layer may be an indium tin oxide layer. The base substrate may be formed of an insulating material, for example, the base substrate may include a first polyimide (PI) layer, a first silicon oxide (SiO) layer, an amorphous silicon layer, a second PI layer, and a second SiO layer that are arranged in sequence.

In the exemplary embodiments, a plurality of power supply lines in the second source-drain layer may be connected to each other. Therefore, as shown in FIG. 3, part of the power supply lines VDD located in the second display area may be disconnected in the first display area. In this way, on the one hand, the RC loading of the power supply lines VDD can be reduced; on the other hand, the number of transparent bridging line segments in the first display area can be reduced, thereby increasing the light transmittance of the first display area.

The exemplary embodiments also provide a display device, which includes the above display panel, and a sensing device directly opposite to the first display area of the display panel. The display device may be a display device such as a mobile phone or a tablet computer.

Other embodiments of the present disclosure will readily suggest themselves to those skilled in the art upon consideration of the specification and practice of what is disclosed herein. This application is intended to cover any variations, uses, or adaptations of the present disclosure that follow the general principles of the present disclosure and include common knowledge or techniques in the technical field not disclosed by the present disclosure. The specification and embodiments are to be regarded as exemplary only, with the true scope and spirit of the disclosure being indicated by the claims.

It is to be understood that the present disclosure is not limited to the precise structures described above and illustrated in the accompanying drawings, and that various modifications and changes may be made without departing from the scope thereof. The scope of the present disclosure is limited only by the appended claims.

What is claimed is:

1. A display panel, comprising a first display area and a second display area, and further comprising:

a plurality of first pixel islands in the first display area, comprising:

at least one first light-emitting unit;

at least one first pixel driving circuit, arranged in a one-to-one correspondence with the at least one first light-emitting unit, and configured to provide a driving current to a first light-emitting unit corresponding thereto;

a plurality of first signal line segments configured to provide signals to the at least one first pixel driving circuit; and a base substrate on one side of which the plurality of first pixel islands are provided;

wherein in a same first pixel island, an orthographic projection of at least one first light-emitting unit on the base substrate is at least partially overlapped with an orthographic projection of a corresponding first pixel driving circuit on the base substrate.

2. The display panel according to claim 1, further comprising:

a color filter layer on a side of the plurality of first pixel islands away from the base substrate, comprising a plurality of first structural portions in the first display area, wherein:

the plurality of first structural portions are arranged in a one-to-one correspondence with the plurality of the first pixel islands, an orthographic projection of a first structural portion on the base substrate covers an orthographic projection of a corresponding first pixel island on the base substrate, and at least one side or corner of the orthographic projection of the first structural portion on the base substrate is arc-shaped; and the plurality of first structural portions comprise:

a first light-shielding portion on which at least one opening is formed, the at least one opening on the first light-shielding portion being arranged in a one-to-one correspondence with the at least one first light-emitting unit in the plurality of first pixel islands; and a first filter portion in an opening of the first light-shielding portion, an orthographic projection of the first filter portion on the base substrate covering an orthographic projection of a corresponding first light-emitting unit on the base substrate.

3. The display panel according to claim 2, further comprising a plurality of second light-emitting units in the second display area, wherein the color filter layer further comprises a second structural portion in the second display area, the second structural portion comprising:

a second light-shielding portion on which a plurality of openings are formed, the plurality of openings on the second light-shielding portion being arranged in a one-to-one correspondence with the plurality of second light-emitting units; and a second filter portion in an opening of the second light-shielding portion, an orthographic projection of the second filter portion on the base substrate covering an orthographic projection of a corresponding second light-emitting unit on the base substrate.

4. The display panel according to claim 1, further comprising:

a plurality of second light-emitting units in the second display area;

wherein a pixel density of the first display area is less than or equal to a pixel density of the second display area; and in light-emitting units of a same color, an orthographic projection area of a first light-emitting unit on the base substrate is different from an orthographic projection area of a second light-emitting unit on the base substrate.

5. The display panel according to claim 1, further comprising:

a first pixel driving circuit in the first display area; and a second pixel driving circuit in the second display area;

wherein an orthographic projection area of the first pixel driving circuit on the base substrate is smaller than an orthographic projection area of the second pixel driving circuit on the base substrate.

6. The display panel according to claim 1, further comprising:

a first pixel driving circuit in the first display area; and a second pixel driving circuit in the second display area;

wherein in at least one direction, a gap between orthographic projections of two adjacent first pixel driving circuits on the base substrate is smaller than a gap between orthographic projections of two adjacent second pixel driving circuits on the base substrate.

7. The display panel according to claim 1, further comprising:

a plurality of transparent bridging line segments in the first display area, at least partially configured to connect first signal line segments in different first pixel islands through via holes;

wherein the plurality of first signal line segments comprise:

a first sub-signal line segment, an orthographic projection of the first sub-signal line segment on the base substrate extending along a first direction; and a second sub-signal line segment, an orthographic projection of the second sub-signal line segment on the base substrate extending along a second direction, the first direction intersecting with the second direction; and the plurality of transparent bridging line segments comprise:

a first transparent bridging line segment that comprises:

a first sub-transparent bridging line segment in the first display area, configured to connect first sub-signal line segments in different first pixel islands through via holes; and a second transparent bridging line segment that comprises:

a second sub-transparent bridging line segment in the first display area, configured to connect second sub-signal line segments in different first pixel islands through via holes.

8. The display panel according to claim 7, wherein the first transparent bridging line segment and the first sub-signal line segment connected to each other form a first extension line, and the second transparent bridging line segment and the second sub-signal line segment connected to each other form a second extension line;

an intersection, of an orthographic projection of the first extension line on the base substrate and an orthographic projection of the second extension line on the base substrate, is located at an intersection, of the orthographic projection of the second sub-signal line segment on the base substrate and an orthographic projection of the first transparent bridging line segment on the base substrate; or an intersection, of an orthographic projection of the first extension line on the base substrate and an orthographic projection of the second extension line on the base substrate, is located at an intersection, of the orthographic projection of the first sub-signal line segment on the base substrate and an orthographic projection of the second transparent bridging line segment on the base substrate.

9. The display panel according to claim 7, wherein a plurality of first sub-signal line segments and a plurality of second sub-signal line segments are provided;

the plurality of first sub-signal line segments comprise at least one type of: a gate drive signal line, an enable signal line, an initial signal line, and a reset signal line; and the plurality of second sub-signal line segments comprise at least one type of: a data line and a power line.

10. The display panel according to claim 9, wherein at least one first pixel island, among the plurality of first pixel islands, comprises a first connection line;

in the at least one first pixel island, a first sub-signal line segment comprises a gate driving signal line and a reset signal line, the gate driving signal line and the reset signal line with a same timing signal being connected through the first connection line; and one signal line, among the gate driving signal line and the reset signal line connected by the first connection line, is connected through a first transparent bridging line segment to a signal line corresponding thereto and other than the gate driving signal line and the reset signal line.

11. The display panel according to claim 9, wherein at least one first pixel island, among the plurality of first pixel islands, comprises a second connection line;

in the at least one pixel island, a first sub-signal line segment comprises n initial signal lines electrically connected by the second connection line, n being a positive integer greater than 1; and m initial signal lines, among the n initial signal lines connected by the second connection line, are connected through a first transparent bridging line segment to a signal line corresponding thereto and other than the n initial signal lines, m being a positive integer less than or equal to n and greater than 0.

12. The display panel according to claim 7, further comprising:

a plurality of second light-emitting units in the second display area;

a plurality of second pixel driving circuits in the second display area, arranged in a one-to-one correspondence with the plurality of second light-emitting units, and configured to provide a driving current to a second light-emitting unit corresponding thereto; and a plurality of second signal line segments in the second display area, configured to provide signals to the plurality of second pixel driving circuits;

wherein the plurality of transparent bridging line segments are at least partially configured to connect the plurality of first signal line segments and the plurality of second signal line segments through via holes.

13. The display panel according to claim 12, wherein the plurality of second signal line segments comprise:

a third sub-signal line segment, an orthographic projection of the third sub-signal line segment on the base substrate extending along the first direction; and a fourth sub-signal line segment, an orthographic projection of the fourth sub-signal line segment on the base substrate extending along the second direction;

the plurality of first transparent bridging line segments further comprise:

a third sub-transparent bridging line segment in the first display area, configured to connect a first sub-signal line segment and a third sub-signal line segment through via holes; and the plurality of second transparent bridging line segments further comprise:

a fourth sub-transparent bridging line segment in the first display area, configured to connect a second sub-signal line segment and a fourth sub-signal line segment through via holes.

14. The display panel according to claim 12, wherein the plurality of second light-emitting units comprise: a first red (R) light-emitting unit, a first green (G) light-emitting unit, and a first blue (B) light-emitting unit;

the first R light-emitting unit, the first G light-emitting unit, and the first B light-emitting units are alternately distributed along a same light-emitting unit row;

in the same light-emitting unit row, two first G light-emitting units distributed along a column direction are between the first R light-emitting unit and the first B light-emitting unit;

in adjacent light-emitting unit rows, light-emitting units having a same color are located in different light-emitting unit columns; and in two light-emitting unit rows separated by one light-emitting unit row, the light-emitting units having the same color are located in a same light-emitting unit column; and the at least one first light-emitting unit in the plurality of first pixel islands comprises: a second R light-emitting unit, a second G light-emitting unit, a third G light-emitting units, and a second B light-emitting unit.

15. The display panel according to claim 14, wherein in a same first pixel island, the second G light-emitting unit is in a first light-emitting unit row, the second R light-emitting unit and the second B light-emitting unit are adjacent to each other in a second light-emitting unit row, and the third G light-emitting unit is in a third light-emitting unit row, the second light-emitting unit row being between the first light-emitting unit row and the third light-emitting unit row; and the second B light-emitting unit is in a first light-emitting unit column, the second G light-emitting unit and the third G light-emitting unit are in a second light-emitting unit column, and the second R light-emitting unit is in a third light-emitting unit column, the second light-emitting unit column being between the first light-emitting unit column and the third light-emitting unit column.

16. The display panel according to claim 14, wherein the second R light-emitting unit and the second G light-emitting unit are in a first light-emitting unit row, the second B light-emitting unit is in a second light-emitting unit row, and the third G light-emitting unit is in a third light-emitting unit row, the second light-emitting unit row being between the first light-emitting unit row and the third light-emitting unit row; and the second R light-emitting unit is in a first light-emitting unit column, the second B light-emitting unit is in a second light-emitting unit column, and the second G light-emitting unit and the third G light-emitting unit are in a third light-emitting unit column, the second light-emitting unit column being between the first light-emitting unit column and the third light-emitting unit column.

17. The display panel according to claim 14, wherein the second R light-emitting unit, the second G light-emitting unit, and the second B light-emitting unit are in a first light-emitting unit row, and the third G light-emitting unit is in a second light-emitting unit row, the first light-emitting unit row and the second light-emitting unit row being adjacent to each other; and the second R light-emitting unit is in a first light-emitting unit column, the second G light-emitting unit is in a second light-emitting unit column, the second B light-emitting unit is in a third light-emitting unit column, and the third G light-emitting unit is in a fourth light-emitting unit column, the first light-emitting unit column, the second light-emitting unit column, the third light-emitting unit column and the fourth light-emitting unit column being distributed sequentially in a row direction.

18. The display panel according to claim 14, wherein the second R light-emitting unit, the second G light-emitting unit, and the third G light-emitting unit are in a first light-emitting unit row, and the second B light-emitting unit is in a second light-emitting unit row, the first light-emitting unit row and the second light-emitting unit row being adjacent to each other; and the second R light-emitting unit is in a first light-emitting unit column, the second B light-emitting unit is in a second light-emitting unit column, and the second G light-emitting unit and the third G light-emitting unit are in a third light-emitting unit column, the second light-emitting unit column being between the first light-emitting unit column and the third light-emitting unit column.

19. A display device, comprising:

the display panel according to claim 1; and a sensing device directly opposite to the first display area of the display panel.

\*    \*    \*    \*    \*